United States Patent [19]

Shimizu

[11] Patent Number: 5,511,027
[45] Date of Patent: Apr. 23, 1996

[54] SEMICONDUCTOR MEMORY APPARATUS HAVING A PLURALITY OF WORD LINE DRIVE CIRCUITS

[75] Inventor: Mitsuru Shimizu, Sakura, Japan

[73] Assignee: Kabushiki Kaisha Toshiba, Kawasaki, Japan

[21] Appl. No.: 459,948

[22] Filed: Jun. 2, 1995

Related U.S. Application Data

[63] Continuation of Ser. No. 186,374, Jan. 25, 1994, abandoned.

[30] Foreign Application Priority Data

Jan. 25, 1993 [JP] Japan .................................. 5-009904
Dec. 24, 1993 [JP] Japan .................................. 5-325602

[51] Int. Cl.⁶ .............................. G11C 7/00; G11C 8/00
[52] U.S. Cl. ............... 365/189.09; 365/222; 365/230.03; 365/230.06
[58] Field of Search ..................... 365/189.09, 189.01, 365/230.03, 230.06, 222, 230.08

[56] References Cited

U.S. PATENT DOCUMENTS 4,933,907  6/1990  Kumanoya et al. .................... 365/222
5,010,259  4/1991  Inoue et al. ......................... 365/189.11
5,287,312  2/1994  Okamura et al. ..................... 365/201
5,311,476  5/1994  Kajimoto et al. ..................... 365/222
5,335,205  8/1994  Ogihara ........................... 365/230.06
5,373,475  12/1994 Nagase ............................. 365/230.03

FOREIGN PATENT DOCUMENTS 0284102  9/1988  European Pat. Off. .
8602182  4/1986  WIPO .

*Primary Examiner*—David C. Nelms
*Assistant Examiner*—Huan Hoang
*Attorney, Agent, or Firm*—Banner & Allegretti, Ltd.

[57] ABSTRACT

According to this invention, word line drive circuits are respectively connected to memory cell arrays. These memory cell arrays are respectively driven by the word line drive circuits. Therefore, the potential of a normal word line selected simultaneously with a word line in which a failure has occurred and which is included in a memory cell array can be prevented from being decreased so as to prevent the normal word line from the failure. For this reason, the yield can be increased without unnecessarily using a redundancy circuit.

43 Claims, 17 Drawing Sheets

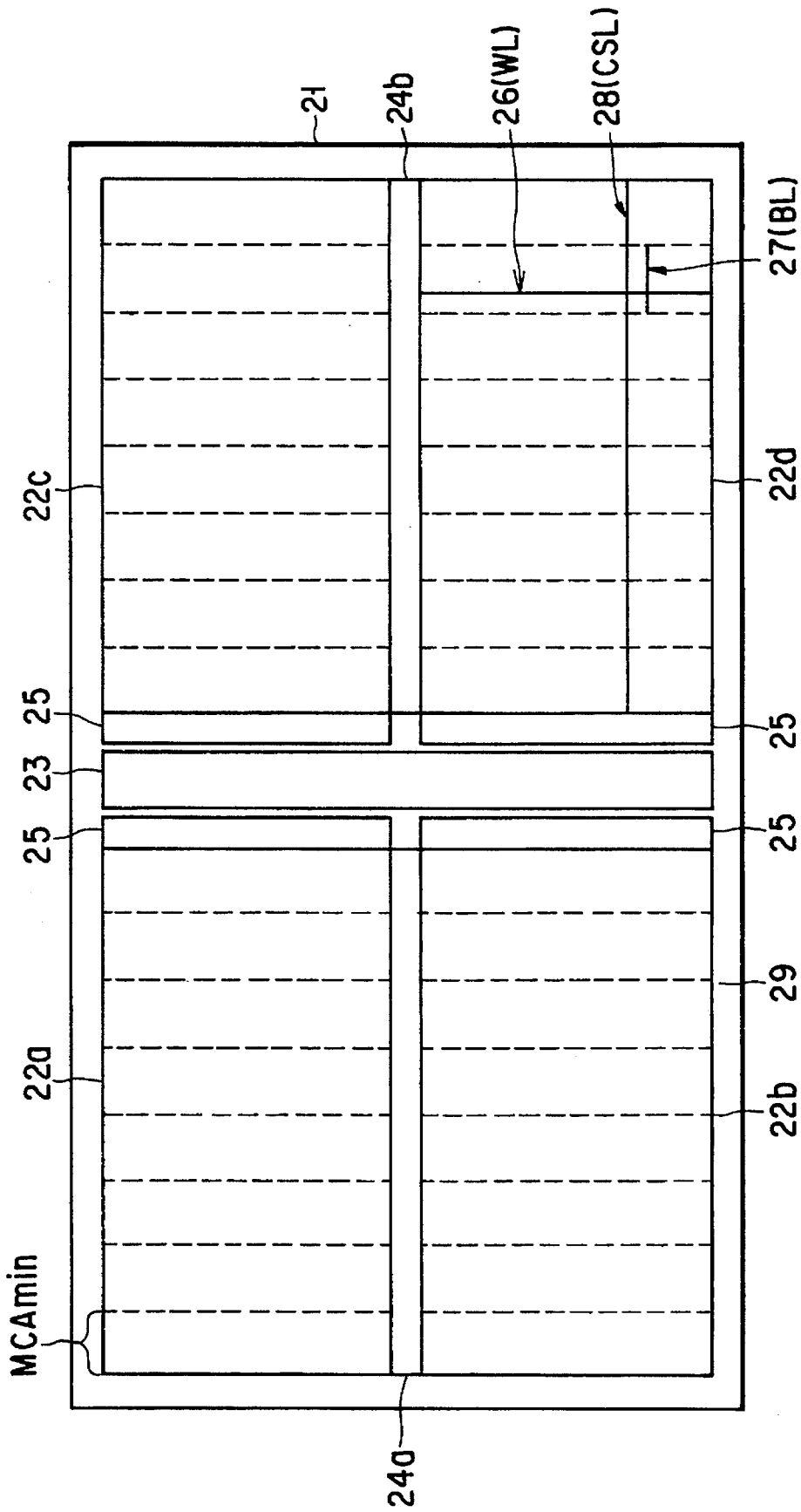
F I G. 2

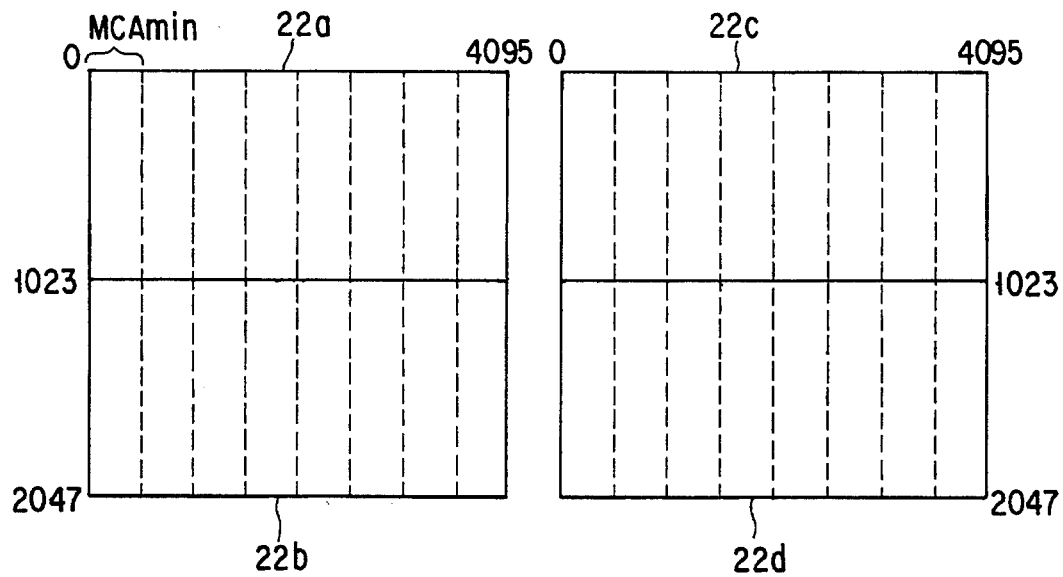
F I G. 3
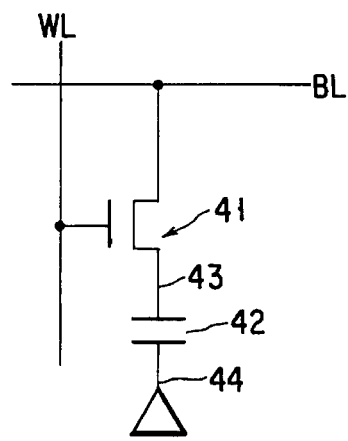
F I G. 4
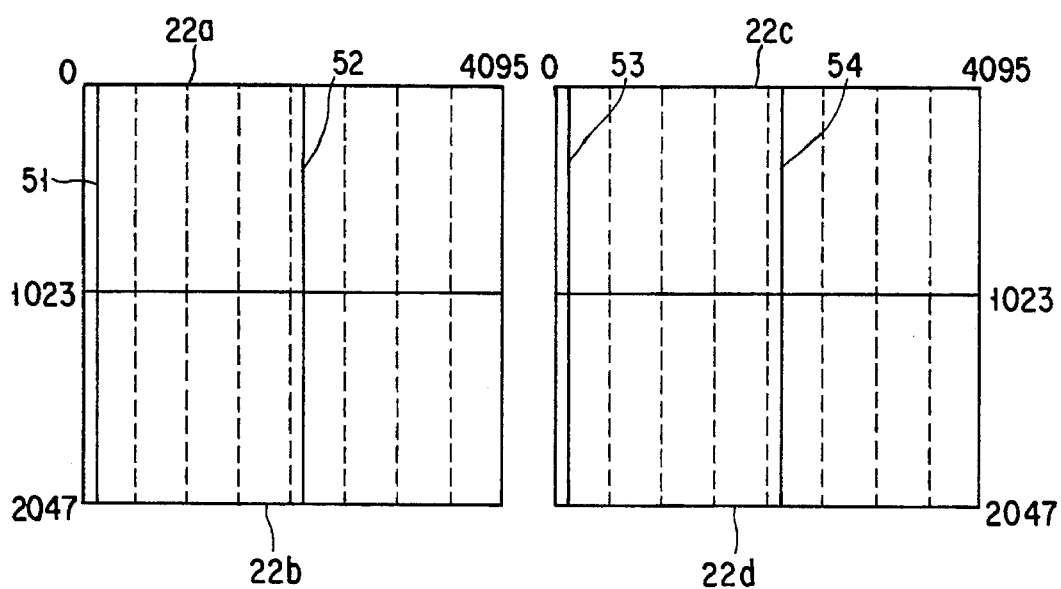
F I G. 5

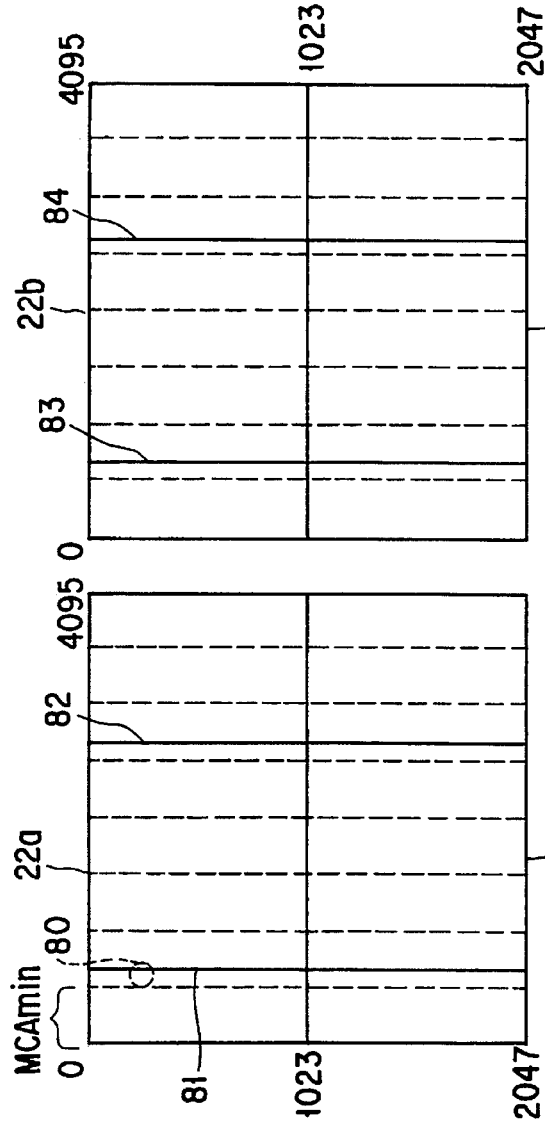
F I G. 8
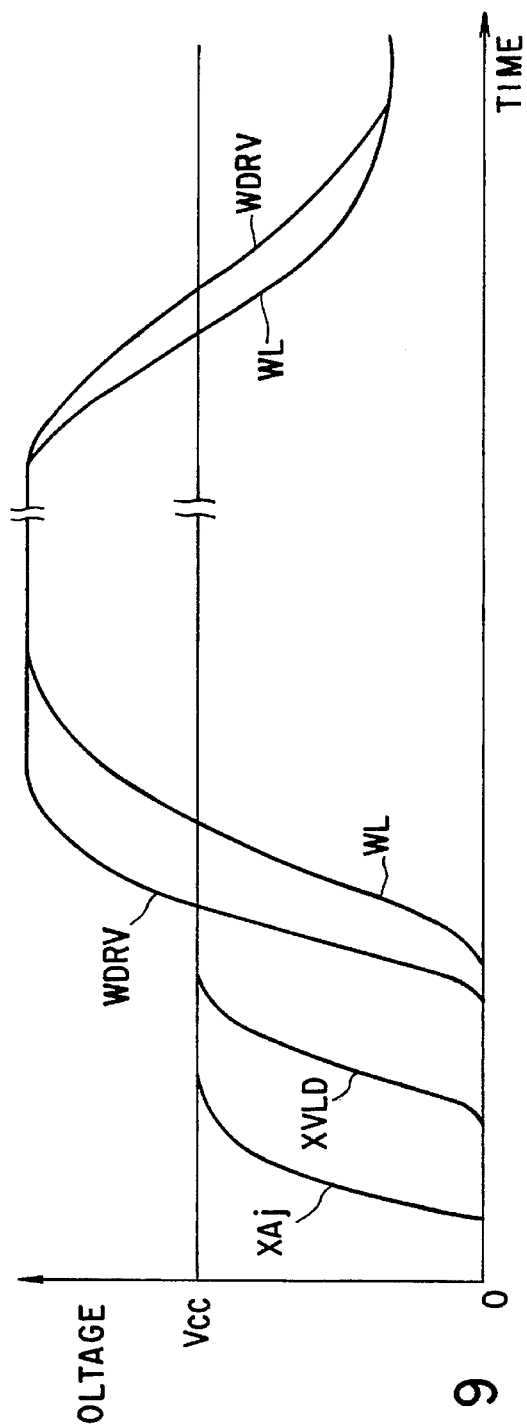
F I G. 9

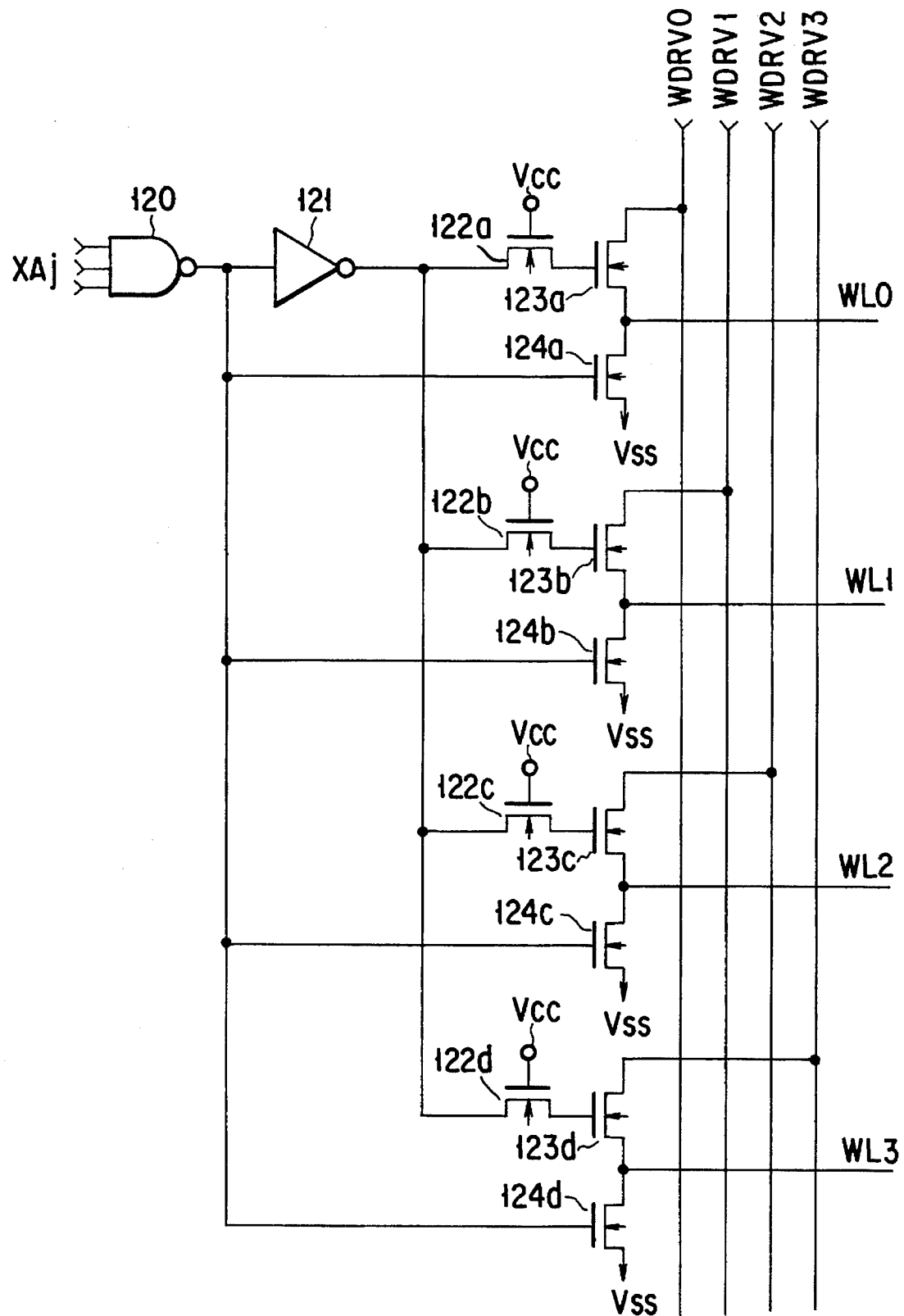
F I G. 13

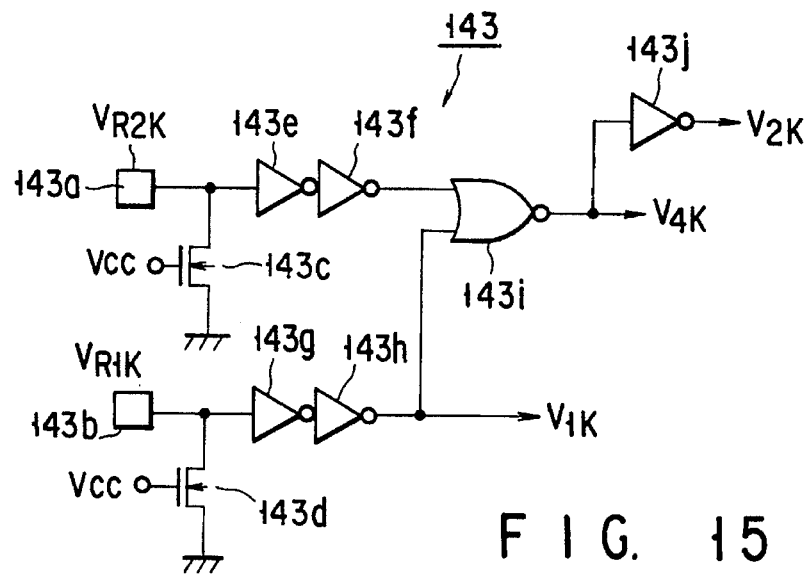
F I G. 15
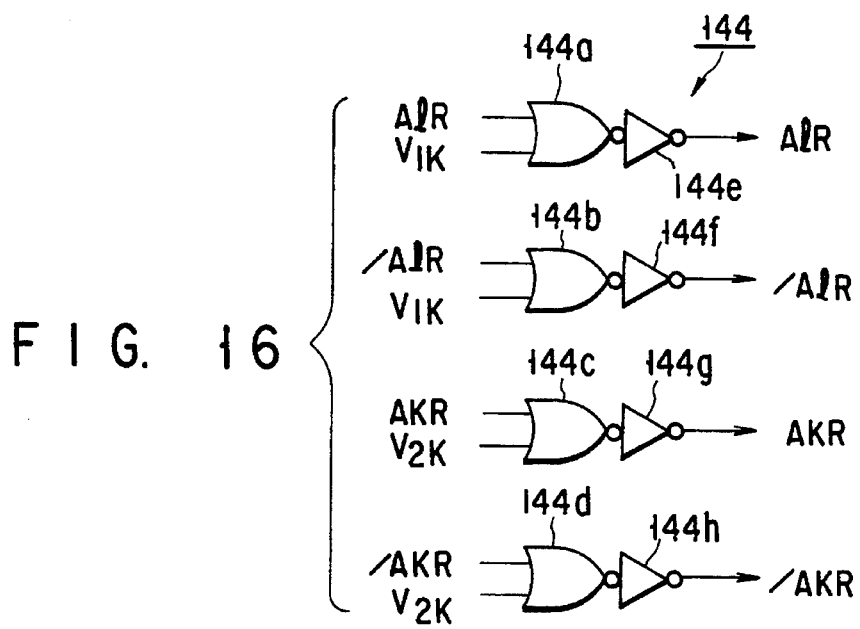
F I G. 16
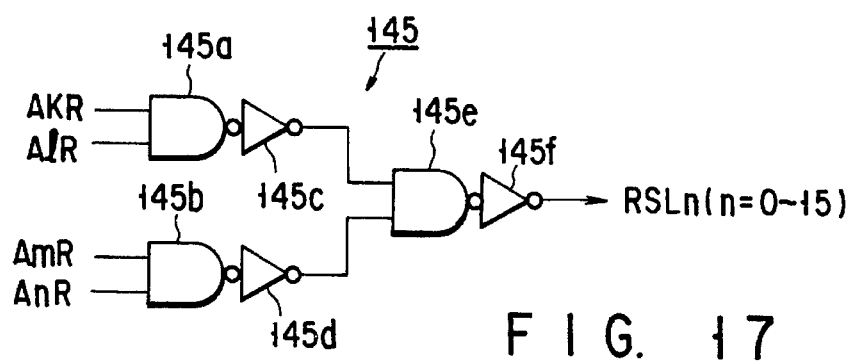
F I G. 17

FIG. 18

| OUTPUT SIGNAL | RSLn | RSL0 | RSL1 | RSL2 | RSL3 | RSL4 | RSL5 | RSL6 | RSL7 |
|---|---|---|---|---|---|---|---|---|---|
| INPUT SIGNAL | AkR | /AkR | /AkR | /AkR | /AkR | /AkR | /AkR | /AkR | /AkR |
| | AℓR | /AℓR | /AℓR | /AℓR | /AℓR | AℓR | AℓR | AℓR | AℓR |
| | AmR | /AmR | /AmR | AmR | AmR | /AmR | /AmR | AmR | AmR |
| | AnR | /AnR | AnR | /AnR | AnR | /AnR | AnR | /AnR | AnR |

FIG. 21

| INPUT SIGNAL | /AkR | /AkR | AkR | AkR |
|---|---|---|---|---|
| | /AℓR | AℓR | /AℓR | AℓR |
| OUTPUT SIGNAL | Aref0 | Aref1 | Aref2 | Aref3 |

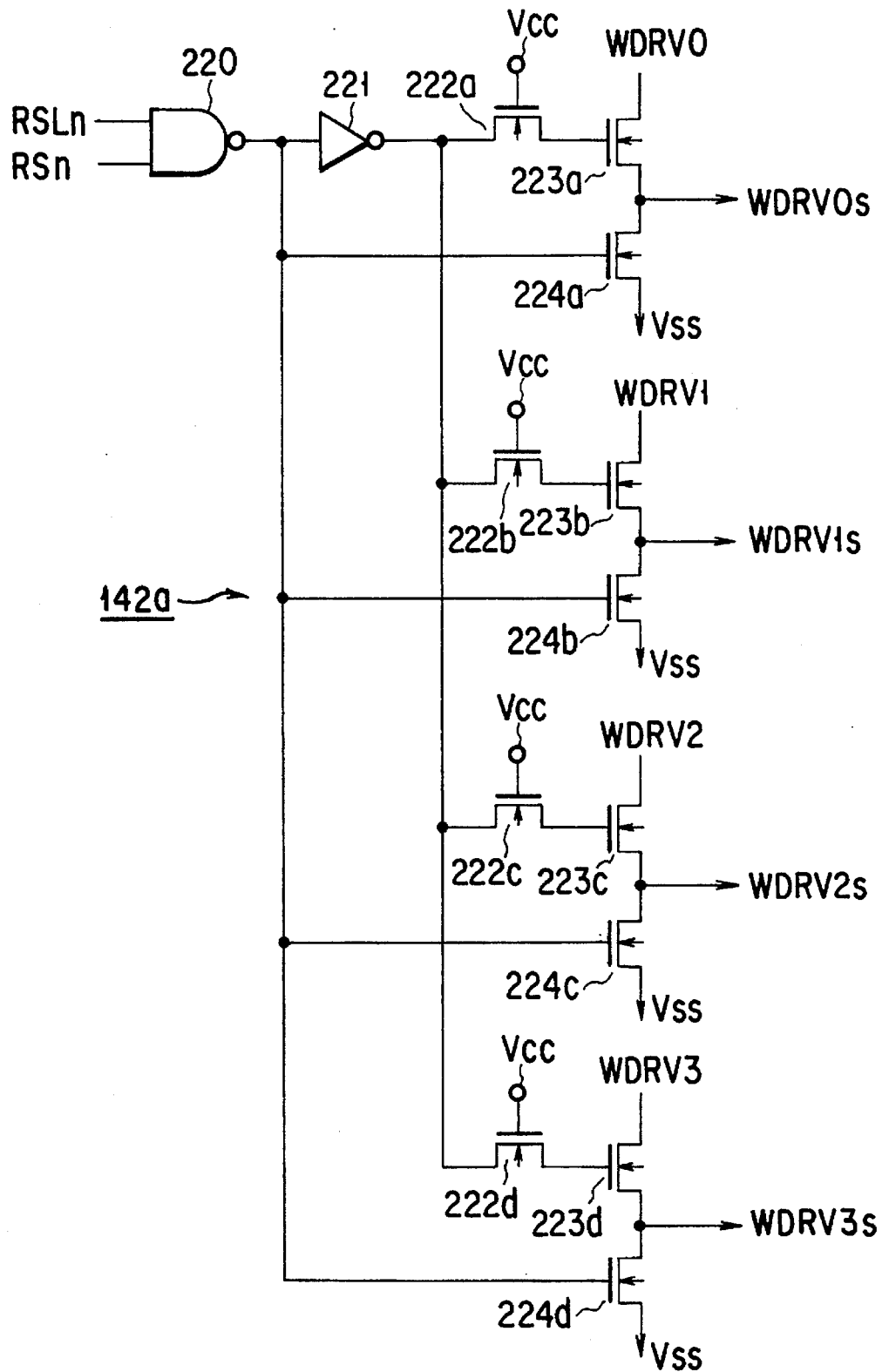
F I G. 22

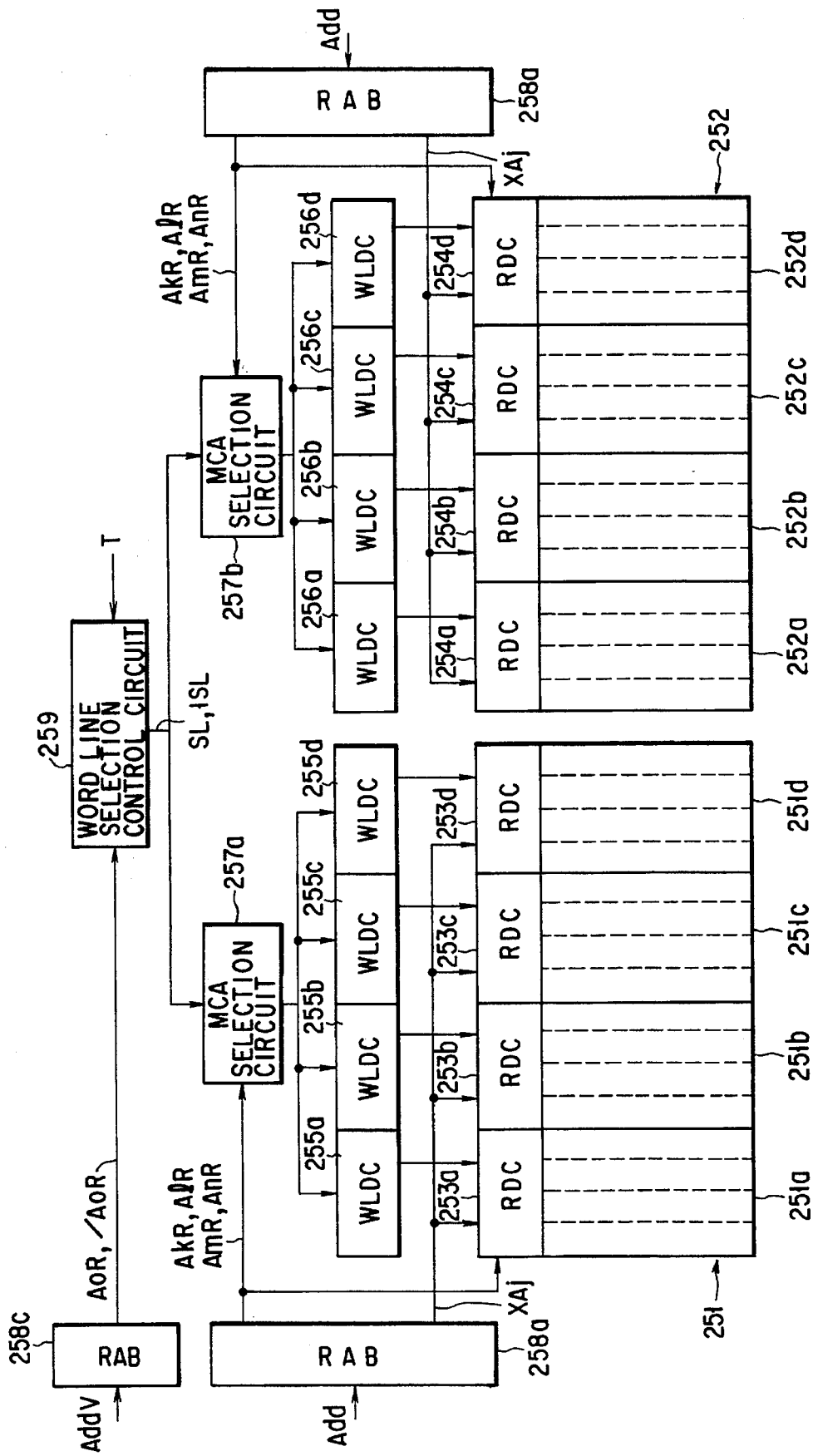
F I G. 25

5,511,027

SEMICONDUCTOR MEMORY APPARATUS HAVING A PLURALITY OF WORD LINE DRIVE CIRCUITS

This application is a continuation of application Ser. No. 08/186,374, filed Jan. 25, 1994, now abandoned.

BACKGROUND OF THE INVENTION

1. Field of the Invention

The present invention relates to a semiconductor memory apparatus, e.g., a dynamic RAM (DRAM) and, more particularly, to a method of driving a word line.

2. Description of the Related Art

A semiconductor memory generally comprises a block which is constituted by regularly repetitive identical patterns such as memory cells and a block which is constituted by irregularly repetitive patterns such as peripheral circuits for accessing the memory cells.

FIG. 2 shows the layout of a DRAM. Memory cell arrays 22a, 22b, 22c, and 22d constituted by regularly repetitive patterns are arranged at the central portion of a semiconductor chip 21. A peripheral circuit 23 constituted by irregularly repetitive patterns is arranged between the memory cell arrays 22a and 22b and the memory cell arrays 22c and 22d. In addition, a peripheral circuit 24a including a row decoder (to be referred to as an "RDC" hereinafter) is arranged between the memory cell arrays 22a and 22b, and a peripheral circuit 24b including an RDC is arranged between the memory cell arrays 22c and 22d. In this DRAM, the peripheral circuit 24a including the RDC is commonly used for the adjacent memory cell arrays 22a and 22b, and the peripheral circuit 24b is commonly used for the adjacent memory cell arrays 22c and 22d.

In addition, peripheral circuits 25 each including a column decoder are arranged between the peripheral circuit 23 and the memory cell arrays 22a and 22d, respectively. In addition, bonding pads (not shown), an input protecting circuit therefor, and a peripheral circuit 29 constituted by irregularly repetitive patterns are arranged at the peripheral portion of the semiconductor chip 21.

Each of the memory cell arrays 22a to 22b is divided into $2^n$ or 2n (n is a natural number) areas as indicated by dotted lines, and each area partitioned by the dotted lines constitutes a minimum memory cell array MCAmin. Referring to FIG. 2, each of the memory cell arrays 22a to 22d is divided into 8 areas and has 8 minimum memory cell arrays MCAmin. A plurality of word lines (WL) 26 are arranged in each memory cell array MCAmin in the row direction, and a plurality of bit lines (BL) 27 are arranged in each memory cell array MCAmin in the column direction. A plurality of column selection lines (CSL) connected to the column decoder are arranged on the area of the memory cell arrays in parallel to the bit lines 27.

In order to understand a bit image from a pattern layout, assume that the chip layout shown in FIG. 2 has a 16-Mbit capacity. FIG. 3 is a map obtained by expressing the chip layout in FIG. 2 as a physical image.

The 4096 word lines 26 are arranged in each of the memory cell arrays 22a to 22d in the row direction. Therefore, 512 word lines are present in each minimum memory cell array MCAmin. On the other hand, bit lines, more accurately, 1024 pairs of bit lines, are arranged in each of the memory cell arrays 22a to 22d in the column direction. Since memory cells are respectively arranged on intersections between the word lines and the bit lines, it is understood that the memory cells have a 16-Mbit capacity.

An actual process of selecting a word line to access data will be described below. When simple read or write access is to be performed, one word line is selected, and data may be accessed from the bit lines crossing the selected word line. However, since a refresh operation is required for a DRAM, it is not necessarily. satisfied that only one word line is selected.

Therefore, a memory cell of the DRAM is shown in FIG. 4, and the operation of the memory cell will be described below. A memory cell of the DRAM is generally constituted by a selection transistor 41 and a capacitor 42, a small charge corresponding to storage data is accumulated and held in a storage node 43 of the capacitor 42. However, leakage necessarily occurs in the capacitor 42. As this leakage, junction leakage which allows charges to flow into a substrate or capacitor insulating film leakage which allows charges to flow into a capacitor electrode 44 is known. Therefore, in order to hold data holding properties, in other words, in order to avoid the leakage, the refresh operation described above must be periodically performed.

This refresh operation is performed for all the memory cells in 512 refresh cycles/8 msec for, a 1 Mbit, and in 1024 refresh cycles/16 msec for, e.g., 16 Mbit depending on an external specification. In the example as described above, since the memory cells have a 16-Mbit capacity, when a refresh operation is performed in 2048 refresh cycles/32 msec, as shown in FIG. 5, at least four word lines 51 to 54 (more accurately, the RDC 24a) are commonly used for the memory cell arrays 22a and 22b, and an RDC 24b is commonly used for memory cell arrays 22c and 22d. For this reason, 8 word lines are selected. In contrast to this, when one word line, e.g., the word line 51, is selected, the three word lines 52 to 54 related to the word line 51 are selected simultaneously with the word line 51. In addition, as shown in FIG. 5, other word lines are not selected at random, and the word lines are selected in units of minimum memory arrays. The memory cell array selected as described above is called an activated memory cell array.

FIG. 6 shows a word line drive circuit including a row decoder (RDC), and FIG. 7 shows the timings of main nodes of the word line drive circuit.

Referring to FIG. 6, a power supply voltage Vcc is applied to the drain and gate of an n-channel MOS transistor (to be referred to as an NMOS hereinafter) 60, and the source of the NMOS 60 is connected to one terminal of a capacitor 61 having a large capacitance. This NMOS 60 is normally set in an ON state, and a potential WBST of the source is set to be the power supply voltage vcc. A row address strobe signal (/RAS) is supplied to a delay circuit 62 obtained by connecting a plurality of inverter circuits in series, and the row address strobe signal is delayed by the delay circuit 62 by a predetermined period of time so as to be output from the delay circuit 62 as a signal XVLD. This signal XVLD is supplied to the other terminal of the capacitor 61, and supplied to the gates of a p-channel MOS transistor (to be referred to as a PMOS hereinafter) 64a and an NMOS 64b through an inverter circuit 63. The PMOS 64a and NMOS 64b constitute an inverter circuit 64.

When the signal XVLD changes from low level to high level, the potential WBST is boosted to a potential higher than the power supply voltage vcc through the capacitor 61, and the PMOS 64a is turned on. For this reason, the boosted potential WBST is applied to each row decoder (RDC) as a word line drive voltage (WDRV). In each row decoder, a word line is selected in accordance with a combination of address signals. The number of word lines selected as described above is the number of word lines determined by the refresh operation described above.

Each row decoder (RDC) is constituted by a NAND circuit 65a for outputting a logic signal in accordance with an internal signal XAj generated in correspondence with an address signal, an inverter circuit 65b, and NMOSs 65c, 65d, and 65e. The NMOS 65d automatically transfers the boosted voltage to a word line WL using capacitive coupling between the gate and channel of the NMOS. The NMOS 65c encloses the potential of a drain node D.

Assume that a failure has occurred due to a certain reason at a portion indicated by reference numeral 80 in the memory cell array 22a shown in FIG. 8, and that a word line is subjected to leakage. This failure can be easily remedied by a redundancy circuit. However, a DRAM is tested in a long cycle, the failure causes a failure bit map indicated by reference numerals 81 to 84. That is, the word lines 82 to 84 selected simultaneously with the word line 81 are regarded as word lines in which failures have occurred.

This is because leakage occurs at the portion 80 in which a failure has occurred and which is shown in FIG. 8. When the long-cycle test is performed, as shown in FIG. 9, the potential of the word line drive voltage (WDRV) is dropped. Therefore, the potential is dropped regardless of charging the capacitor 61, and the word lines selected simultaneously with the word line in which a failure has occurred are damaged to fail.

In this case, the following problem is posed. That is, word lines in which no failure has actually occurred and which are not damaged are remedied by a redundancy circuit together with a word line in which a failure has occurred. For this reason, the word lines which are actually damaged are to be remedied by the redundancy circuit, and the number of damaged word lines may become larger than the number of word lines which can be remedied by the redundancy circuit. In this manner, since products which cannot be remedied are regarded as defective products, a yield is merely decreased.

The number of word lines which can be remedied is as follows. For example, in FIG. 8, it is assumed that one word line in which a failure has occurred can be remedied in each minimum memory cell array MCAmin obtained by dividing a memory cell array with dotted lines. In the semiconductor memory described above, if a failure is present in the word line 82 together with another failure, the minimum memory cell array having the word line 82 cannot be remedied. Therefore, this product is regarded as a defective one.

As described above, in the conventional semiconductor memory apparatus, when a word line is subjected to leakage, and a failure has occurred in the word line due this leakage, a long-cycle test disadvantageously recognizes that failures have occurred in other normal word lines which are selected simultaneously with the word line in which the failure has occurred.

SUMMARY OF THE INVENTION

It is an object of the present invention to provide a semiconductor memory apparatus wherein normal word lines selected simultaneously with a word line in which a failure has occurred are-not recognized as word lines in which failures have occurred, a redundancy circuit can be prevented from being unnecessarily used, and a yield can be increased.

The object of the present invention can be achieved by the following arrangement.

A semiconductor memory apparatus comprises:

a plurality of memory cell arrays including a plurality of word lines;

a plurality of selecting means, arranged in units of the memory cell arrays, for simultaneously selecting word lines of the memory cell arrays in accordance with an address signal; and a plurality of word line drive means, respectively connected to the selecting means, for boosting a power supply voltage to generate a drive voltage for driving the word Lines so as to apply the drive voltage to the selecting means.

According to the present invention, word line drive means are arranged in memory cell arrays or memory cell array blocks or memory cell arrays selected by redundancy circuits, so that the memory cell arrays or memory cell array blocks are respectively driven by the word line drive means. For this reason, the potentials of a plurality of normal word lines selected simultaneously with a word line in which a failure has occurred can be prevented from being dropped. Therefore, the normal word lines selected simultaneously with the word line in which a failure has occurred are prevented from failures, redundancy circuits can be prevented from being unnecessarily used, and a decrease in yield can be prevented.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view showing the layout of a conventional semiconductor memory;

FIG. 3 is a plan view showing a 16-Mbit semiconductor memory map;

FIG. 4 is an equivalent circuit diagram showing a storage element of a DRAM;

FIG. 5 is a plan view showing a memory cell map in a case wherein a word line is selected in accordance with a refresh cycle;

FIG. 8 is a plan view showing a case wherein a long cycle test of a semiconductor memory in which a failure has occurred is performed;

FIG. 9 is a timing chart showing an operation of a word line drive circuit during the long cycle test;

FIG. 13 is a circuit diagram showing a row decoder shown in FIG. 1;

FIG. 15 is a circuit diagram showing a refresh determination circuit shown in FIG. 14;

FIG. 16 is a circuit diagram showing an address control circuit included in a row address buffer circuit shown in FIG. 14;

FIG. 17 is a circuit diagram showing a memory cell array selection circuit shown in FIG. 14;

FIG. 18 is a table showing the relationship between input signals and output signals in FIG. 17;

FIG. 21 is a table showing the relationship between input signals and output signals shown in FIG. 20;

FIG. 22 is a circuit diagram showing a row decoder shown in FIG. 14;

FIG. 25 is a block diagram showing the arrangement of the fourth embodiment of the present invention;

DETAILED DESCRIPTION OF THE PREFERRED EMBODIMENTS

Embodiments of the present invention will be described below with reference to the accompanying drawings.

Figure 1:
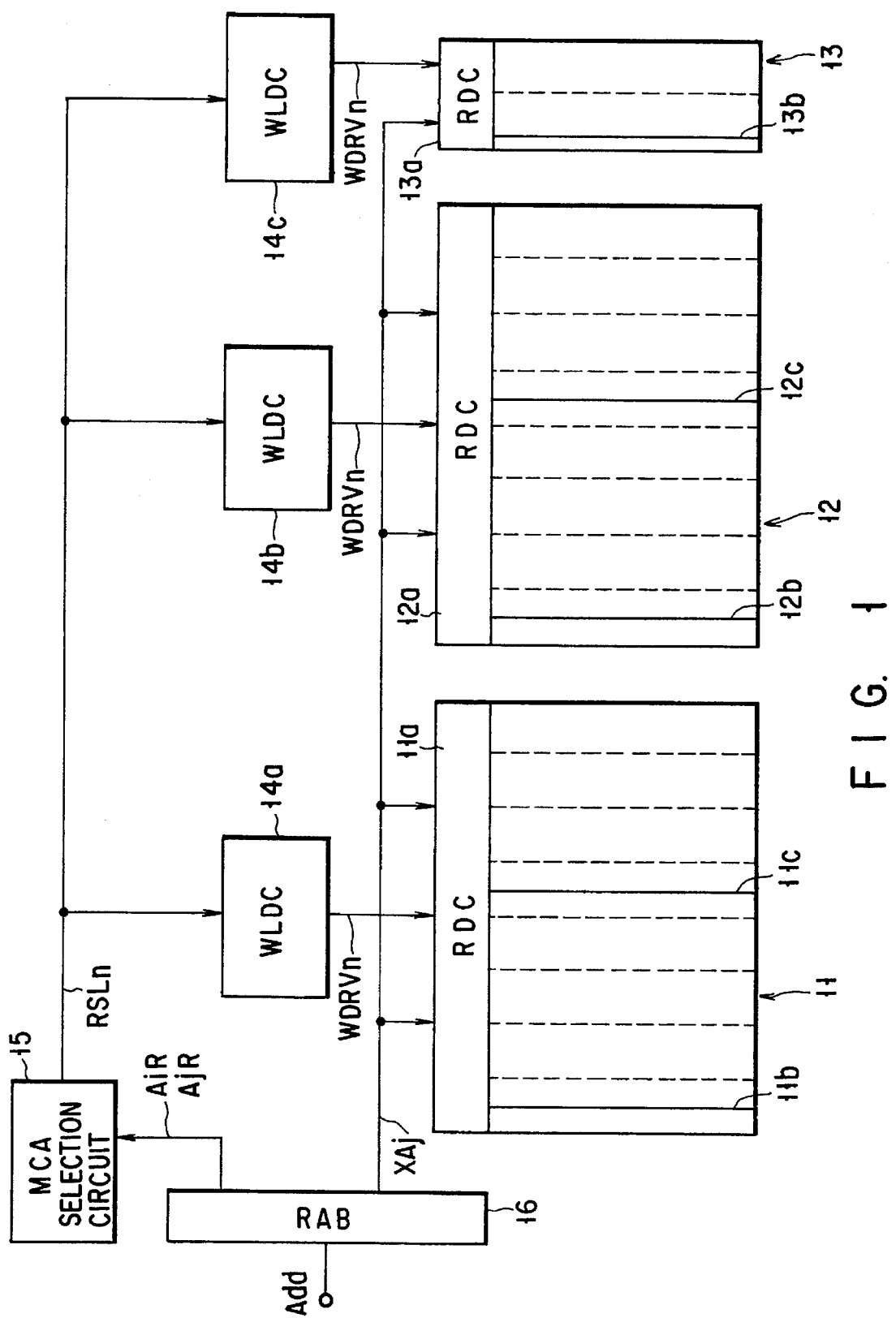
FIG. 1 is a block diagram showing the arrangement of the first embodiment of the present invention.
Figure 6:
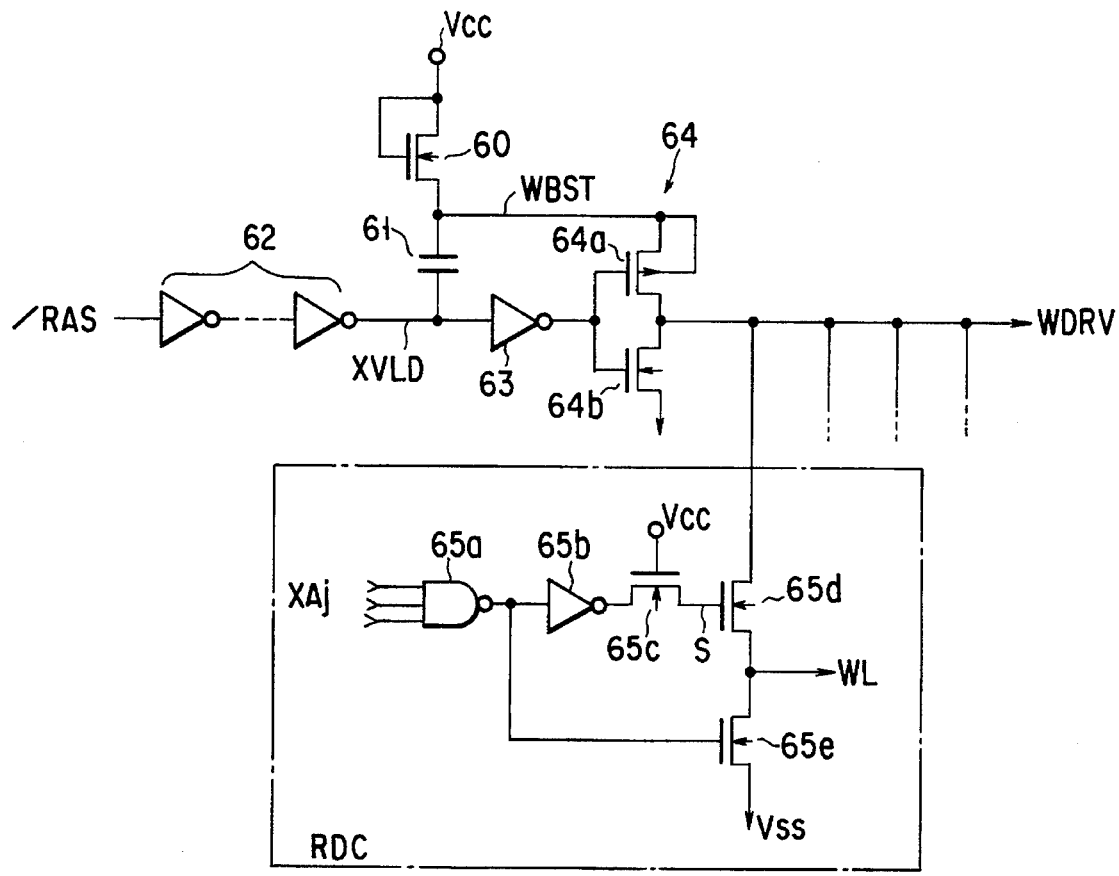
FIG. 6 is a diagram showing the arrangement of a word drive circuit.
Figure 7:
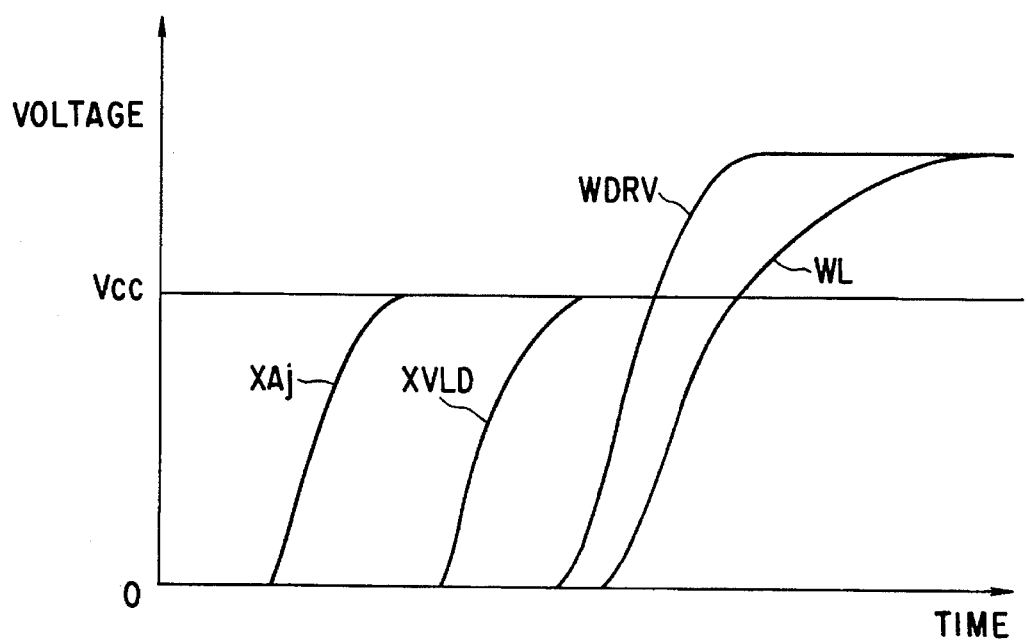
FIG. 7 is a timing chart showing an operation of the word line drive circuit shown in FIG. 6.

FIG. 1 shows the first embodiment of the present invention, in which word line drive circuits are arranged in units of memory cell arrays.

Referring to FIG. 1, a memory cell array 11 corresponds to one of the memory cell arrays 22a and 22b in the semiconductor memory shown in FIG. 2, and a memory cell array 12 corresponds to one of the memory cell arrays 22c and 22d in the semiconductor memory in FIG. 2. Reference numeral 13 denotes a parity memory cell array. Row decoders 11a, 12a, and 13a are provided to the memory cell arrays 11, 12, and 13, respectively. Word line drive circuits (WLDC) 14a, 14b, and 14c are connected to the row decoders 11a, 12a, and 13a, respectively. The word line drive circuits 14a, 14b, and 14c are operated in accordance with an output signal from a memory cell array selection circuit 15, and the memory cell arrays 11, 12, and 13 are simultaneously driven by the word line drive circuits 14a, 14b, and 14c, respectively.

An address signal Add is supplied to a row address buffer circuit (RAB) 16. The row address buffer circuit 16 outputs internal signals AiR, AjR, XAj, and the like corresponding to an address signal constituted by lower two bits of the address signal Add. The internal signals AiR and AjR are supplied to the memory cell array (MCA) selection circuit 15, and memory cell array selection signals RSLn are output from the memory cell array selection circuit 15. The memory cell array selection signals RSLn activate minimum memory cell arrays arranged in the memory cell arrays 11 to 13, and the memory cell array selection signals RSLn are supplied to the word line drive circuits 14a, 14b, and 14c, respectively.

Figure 10:
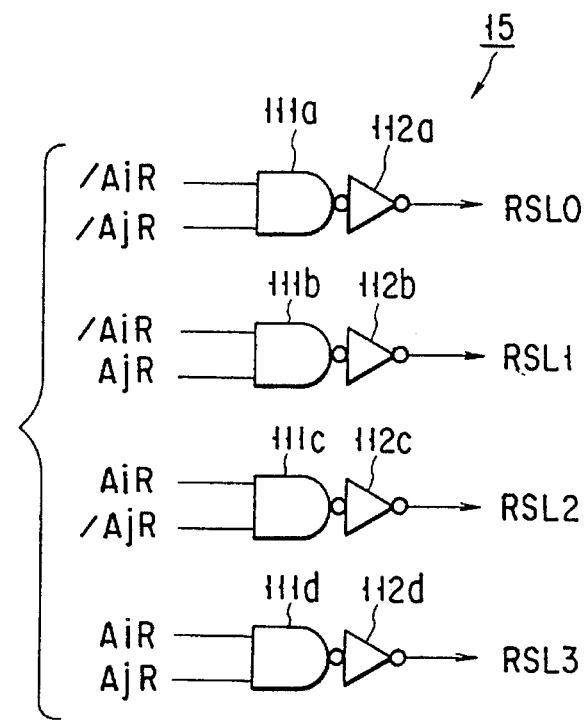
FIG. 10 is a circuit diagram showing a memory cell array selection circuit shown in FIG. 1.

FIG. 10 shows the memory cell array selection circuit 15. The memory cell array selection circuit 15 is constituted by NAND circuits 111a to 111d and inverter circuits 112a to 112d. Internal signals /AiR and /AjR output from the row address buffer circuit 16 are supplied to the input terminals of the NAND circuit 111a, and a memory cell array selection signal RSL0 is output from the inverter circuit 112a connected to the NAND circuit 111a. The internal signals /AiR and AjR are supplied to the input terminals of the NAND circuit 111b, and a memory cell array selection signal RSL1 is output from the inverter circuits 112b connected to the NAND circuit 111b. The internal signals AiR and /AjR are supplied to the input terminals of the NAND circuit 111c, and a memory cell array selection signal RSL2 is output from the inverter circuit 112c connected to the NAND circuit 111c. The internal signals AiR and AjR are supplied to the input terminals of the NAND circuit 111d, and a memory cell array selection signal RSL3 is output from the inverter circuit 112d connected to the NAND circuit 111d.

Figure 11:
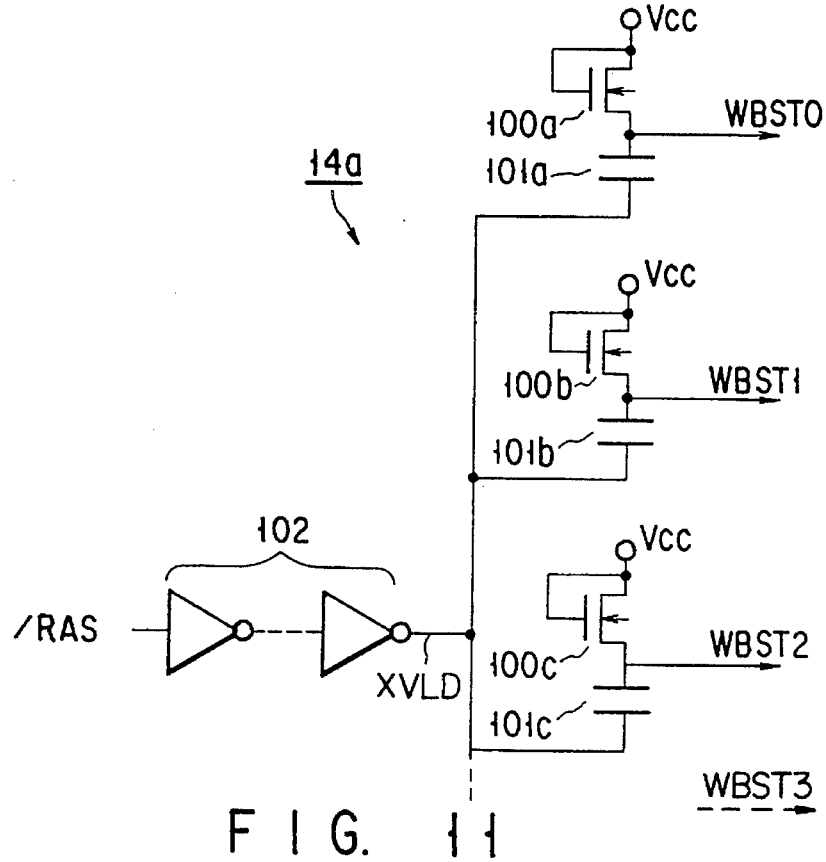
FIG. 11 is a circuit diagram showing part of a word line drive circuit shown in FIG. 1.
Figure 12:
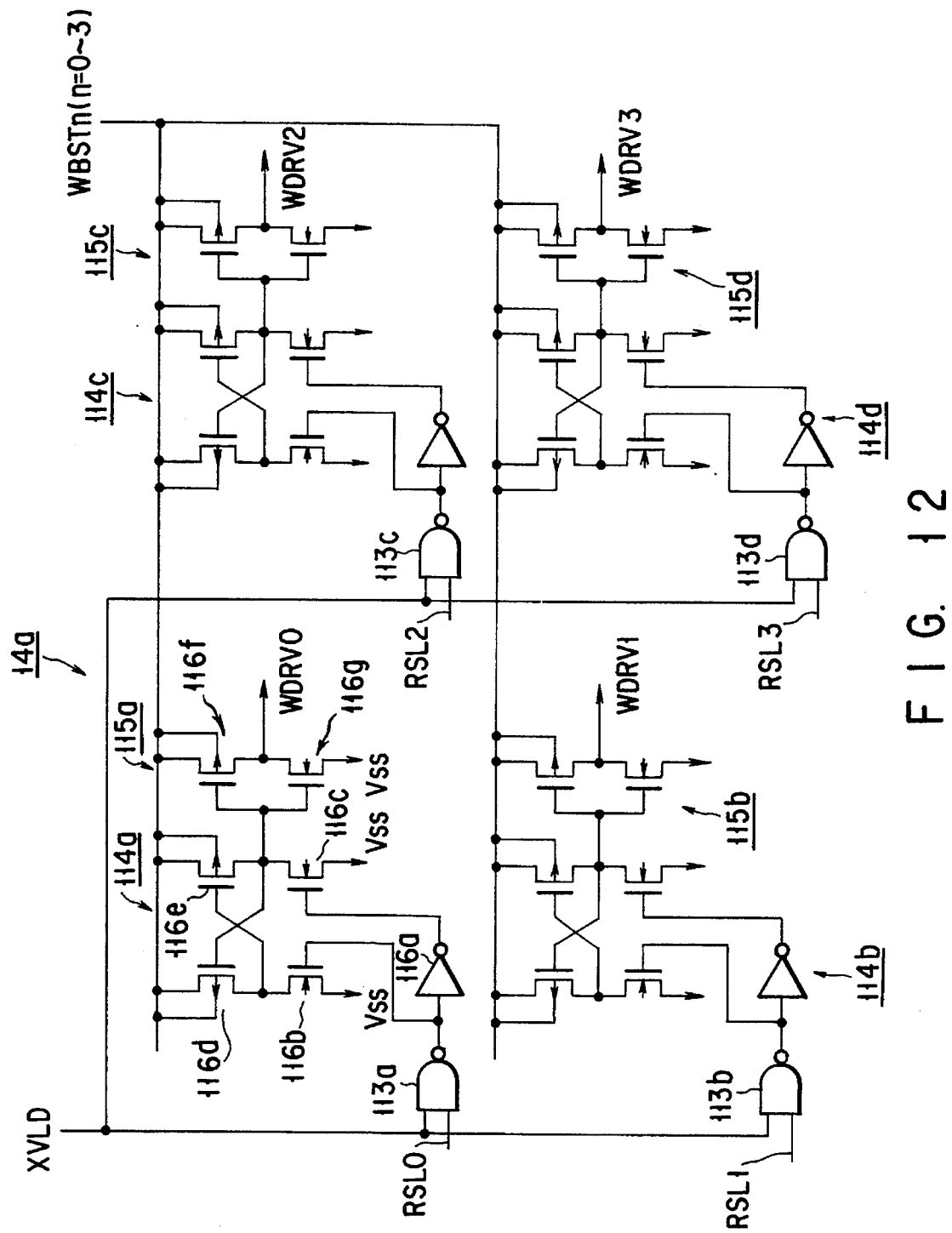
FIG. 12 is a circuit diagram showing part of the word line drive circuit shown in FIG. 1.

FIGS. 11 and 12 show the word line drive circuits 14a, 14b, and 14c. In this case, since the word line drive circuits 14a, 14b, and 14c have identical arrangements, only the word line drive circuit 14a will be described below. Each word line drive circuit is constituted by a boosted potential generating circuit for generating a boosted potential and a word line drive voltage generating circuit for generating a word line drive voltage.

FIG. 11 shows the boosted potential generating circuit. Referring to FIG. 11, a power supply voltage Vcc is applied to the drain and gate of each of NMOSs 100a to 100c, and each source is connected to one terminal of a corresponding one of the capacitors 101a to 101c each having a large capacitance. The NMOSs 100a to 100c are always set in an ON state, and potentials WBST0 to WBST3 of the sources are set to be the power supply voltage Vcc. A row address strobe signal /RAS is supplied to a delay circuit formed by connecting a plurality of inverters in series, and a signal XVLD obtained by delaying the row address strobe signal /RAS by a predetermined period of time is output from the delay circuit 102. This signal XVLD is supplied to the other terminal of each of the capacitors 101a to 101c. When the signal XVLD changes from low level to high level in accordance with a change in the row address strobe signal /RAS, the potentials WBST0 to WBST3 are boosted to potentials higher than the power supply voltage vcc through the capacitors 101a to 101c, respectively.

FIG. 12 shows a word line drive voltage generating circuit. Referring to FIG. 12, each of the memory cell array selection signals RSL0 to RSL3 output from the inverter circuits 112a to 112d constituting the memory cell array selection circuit 15 is supplied to one terminal of a corresponding one of NAND circuits 113a to 113d. The signal XVLD is supplied to the other terminal of each of the NAND circuits 113a to 113 d. Output signals from the NAND circuits 113a to 113d are supplied to the inverter circuits 115a to 115d through level conversion circuits 114a to 114d. The internal signals AiR and AjR and memory cell array selection signals RSLn (n=0 to 3) generated by these internal signals are signals at the power supply potential (vcc level). The level conversion circuits 114a to 114d convert the signals at the power supply potential into signals at boosted potential WBSTn levels, and the signals at the potentials WBSTn are supplied to the inverter circuits 115a to 115d for outputting the potentials WBSTn, respectively. Therefore, the inverter circuits 115a to 115d are prevented from being erroneously operated.

Since the sets of the level conversion circuits 114a to 114d and the inverter circuits 115a to 115d have identical arrangements, only the arrangement of the set of the level conversion circuit 114a and the inverter circuit 115a will be described below. The input terminals of the gates of an inverter circuit 116a and an NMOS 116b are connected to the output terminal of the NAND circuit 113a. The output terminal of the inverter circuit 116a is connected to the gate of an NMOS 116c. The sources of the NMOSs 116b and 116c are set to be a predetermined potential Vss. The drain of the NMOS 116b is connected to the drain of a PMOS 116d and the gate of a PMOS 116e, and the drain of the NMOS 116c is connected to the drain of the PMOS 116e and the gate of the PMOS 116d. The boosted potential, e.g., WBST0, is applied to the sources and back gates (substrate) of the PMOSs 116d and 116e.

The gates of a PMOS 116f and an NMOS 116g constituting the inverter circuit 115a are connected to the connection point between the PMOS 116e and the NMOS 116c. The source of the NMOS 116g is set to be the potential Vss, and the drain of the NMOS 116g is connected to the drain of the PMOS 116f. The potential WBST0 is supplied to the source and back gate of the NMOS 116f.

One of the sets of the level conversion circuits 114a to 114d and the inverter circuits 115a to 115d is selected by the memory cell array selection signals RSL0 to RSL3, and a corresponding one of word line drive voltages WDRV0 to WDRV3 is output from the selected one of the inverter circuits 115a to 115d.

FIG. 13 shows an example of the row decoders 11a, 12a, and 13a. The internal signal XAj output from the row address buffer circuit 16 is supplied to the input terminal of a NAND circuit 120. The output terminal of the NAND circuit 120 is connected to the drains of NMOSs 122a to 122d through an inverter circuit 121. The power supply potential Vcc is applied to the gate of each of the NMOSs 122a to 122d. The sources of the NMOSs 122a to 122d are connected to the gates of NMOSs 123a to 123d, respectively. The word line drive voltages WDRV0 to WDRV3 are applied to the drains of the NMOSs 123a to 123d, respectively, and the sources of the NMOSs 123a to 123d are connected to the drains of NMOSs 124a to 124d, respectively. Each source of the NMOSs 124a to 124d is connected to the potential Vss, and the gates of the NMOSs 124a to 124d are connected to the output terminal of the NAND circuit 120. The sources of the NMOSs 123a to 123d are connected to word lines WL0 to WL3, respectively.

With the above arrangement, the NMOSs 122a to 122d are always set in an ON state. When the output signal from the inverter circuit 121 goes to high level in accordance with the internal signal XAj, the word line drive voltages WDRV0 to WDRV3 are applied to the word lines WL0 to WL3 through the NMOSs 123a to 123d, respectively.

According to the first embodiment, the word line drive circuits 14a, 14b, and 14c are simultaneously operated in accordance with the memory cell array signals RSLn output from the memory cell array selection circuit 15, and the memory cell arrays 11, 12, and 13 are simultaneously driven by the word line drive circuits 14a, 14b, and 14c, respectively. Therefore, in each of the memory cell arrays 11, 12, and 13, as shown in FIG. 1, even when a plurality of word lines 11b, 11c, 12b, 12c, and 13b are simultaneously selected, a normal word line is not erroneously regarded as a word line in which a failure has occurred.

Figure 14:
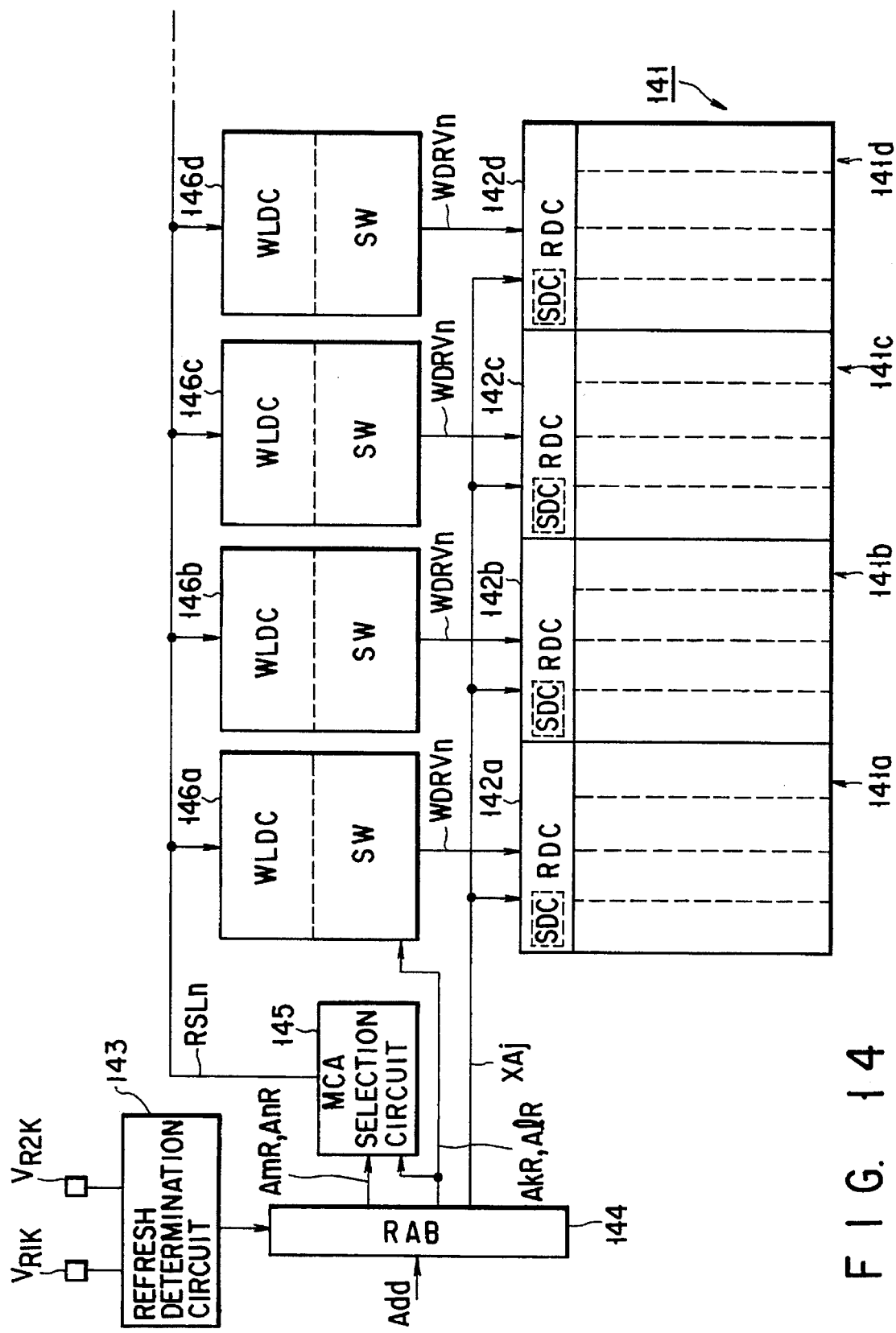
FIG. 14 is a view showing the arrangement of the second embodiment of the present invention.

FIG. 14 shows the second embodiment of the present invention. According to this embodiment, word line drive circuits are controlled in units of refreshing word lines. Referring to FIG. 14, a memory cell array 141 corresponds to the memory cell array 22b shown in FIG. 2. The memory cell array 141 is mainly divided into four memory cell array blocks 141a to 141d as indicated by solid lines in FIG. 14. The number of divided blocks corresponds to the number of word lines simultaneously selected in the refresh operation as described above. Each of the memory cell array blocks 141a to 141d is further divided into four minimum memory cell arrays as indicated by dotted lines in FIG. 14. Row decoders (RDC) 142a to 142d are arranged on the memory cell array blocks 141a to 141d, respectively.

On the other hand, control signals $V_{R1K}$ and $V_{R2K}$ for determining a refresh cycle are supplied to a refresh determination circuit 143. This refresh determination circuit 143 outputs signals $v_{1k}$ and $v_{2k}$ representing the refresh cycle in accordance with the control signals $V_{R1k}$ and $V_{R2k}$. An address signal Add is supplied to a row address buffer circuit (RAB) 144, and the signals $V_{1k}$ and $V_{2k}$ are supplied from the refresh determination circuit 143 to the row address buffer circuit 144. Internal signals AkR, AlR, AmR, AnR, XAj, and the like are output from the row address buffer circuit 144.

The internal signals AkR and AlR set the number of word lines simultaneously selected in accordance with the refresh cycle. The internal signals AkR, AlR, AmR, and AnR are supplied to a memory cell array selection circuit 145, and memory cell array selection signals RSLn are output from the memory cell array selection circuit 145 in accordance with the internal signals AkR, AlR, AmR, AnR. The memory cell array selection signals RSLn activate the minimum memory cell arrays. For example, when n is set to be 0 to 3, the leftmost minimum memory cell array of each memory cell array block is activated in accordance with the signal RSL0, and the minimum memory cell arrays of each memory cell array block are sequentially activated in the right direction. The memory cell array selection signals RSLn are supplied to word line drive circuits 146a to 146d. Each of the word line drive circuits 146a to 146d includes a switch circuit (SW). Each of the switch circuits (SW) switches the number of simultaneously selected word lines in accordance with the internal signals AkR and AlR output from the row address buffer circuit 144. The word line drive circuits (WLDC) 146a to 146d are connected to the row decoders 142a to 142d, respectively. Word line drive voltage WDRVn (n=1 to 3) output from the word line drive circuits 146a to 146d are applied to the row decoders 142a to 142d, respectively.

In addition, the internal signal XAj output from the row address buffer circuit 144 is supplied to each of the row decoders 142a to 142d. The internal signal XAj is a signal for selecting a word line in each minimum memory cell array. A spare decoder SDC constituting a redundancy circuit is arranged in each of the row decoders 142a to 142d, and a spare row is selected in place of a word line in which a failure has occurred by the spare decoder SDC.

FIG. 15 shows the refresh determination circuit 143 in detail. The control signals $V_{R1k}$ and $V_{R2k}$ are supplied to terminals 143a and 143b, respectively. The terminals 143a to 143b are grounded through NMOSs 143c and 143d functioning as resistors. The terminal 143a is connected to one input terminal of a NOR circuit 143i through inverter circuits 143e and 143f, and the terminal 143b is connected to the other terminal of the NOR circuit 143i through inverter circuits 143g and 143h. A signal $V_{1k}$ corresponding to 1-k cycle/refresh is output from the output terminal of the inverter circuit 143h, and a signal $V_{4k}$ corresponding to 4-k cycle/refresh is output from the output terminal of the NOR circuit 143i. An inverter circuit 143j is connected to the output terminal of the NOR circuit 143i, and the signal $V_{2k}$ corresponding to 2-k cycle/refresh is output from the output terminal of the inverter circuit 143j.

FIG. 16 shows an address control circuit included in the row address buffer circuit 144. The upper two bits of an address signal are controlled in accordance with the signals $V_{1k}$ and $V_{2k}$ output from the refresh determination circuit 143. That is, this address control circuit is constituted by NOR circuits 144a to 144d and inverter circuits 144e to 144h respectively connected to the NOR circuits 144a to 144d. An internal signal AlR and the signal $V_{1k}$ are supplied to the input terminal of the NOR circuit 144a, and the internal signal AlR is output from the inverter circuit 144e. An internal signal/AlR and the signal $V_{1k}$ are supplied to the input terminal of the NOR circuit 144b, and the internal signal/AlR is output from the inverter circuit 144f. The internal signal AkR and the signal $V_{2k}$ are supplied to the input terminal of the NOR circuit 144c, and the internal signal AkR is output from the inverter circuit 144g. An internal signal/AkR and the signal $V_{2k}$ are supplied to the input terminal of the NOR circuit 144d, and the internal signal/AkR is output from the inverter circuit 144h.

FIG. 17 is a schematic view showing the memory cell array selection circuit 145, and FIG. 18 is a table showing the relationship between input signals and output signals in FIG. 17.

The memory cell array selection circuit 145 includes 16 circuits, one of which is shown in FIG. 17. The internal signals AkR and AlR are supplied to the input terminal of a NAND circuit 145a, and internal signals AmR and AnR are supplied to the input terminal of a NAND circuit 145b. The output terminal of the NAND circuit 145a is connected to one input terminal of a NAND circuit 145e through an inverter circuit 145c, and the output terminal of the NAND circuit 145b is connected to the other input terminal of the NAND circuit 145e through an inverter circuit 145d. The output terminal of the NAND circuit 145e is connected to the input terminal of an inverter circuit 145f. Memory cell array selection signals RSLn (n=0 to 15) are output from the output terminal of the inverter circuit 145f.

FIG. 18 shows only the memory cell array selection signals RSL0 to RSL7. Although these memory cell arrays selection signals RSL0 to RSL7 correspond to the internal signal/AkR obtained by inverting the internal signal AkR, the memory cell array selection signals RSL8 to RSL15 (not shown) correspond to the internal signal AkR. The logic of the internal signals AlR, AmR, and AnR is the same as that of the memory cell array selection signal RSL0 to RSL7.

Figure 19:
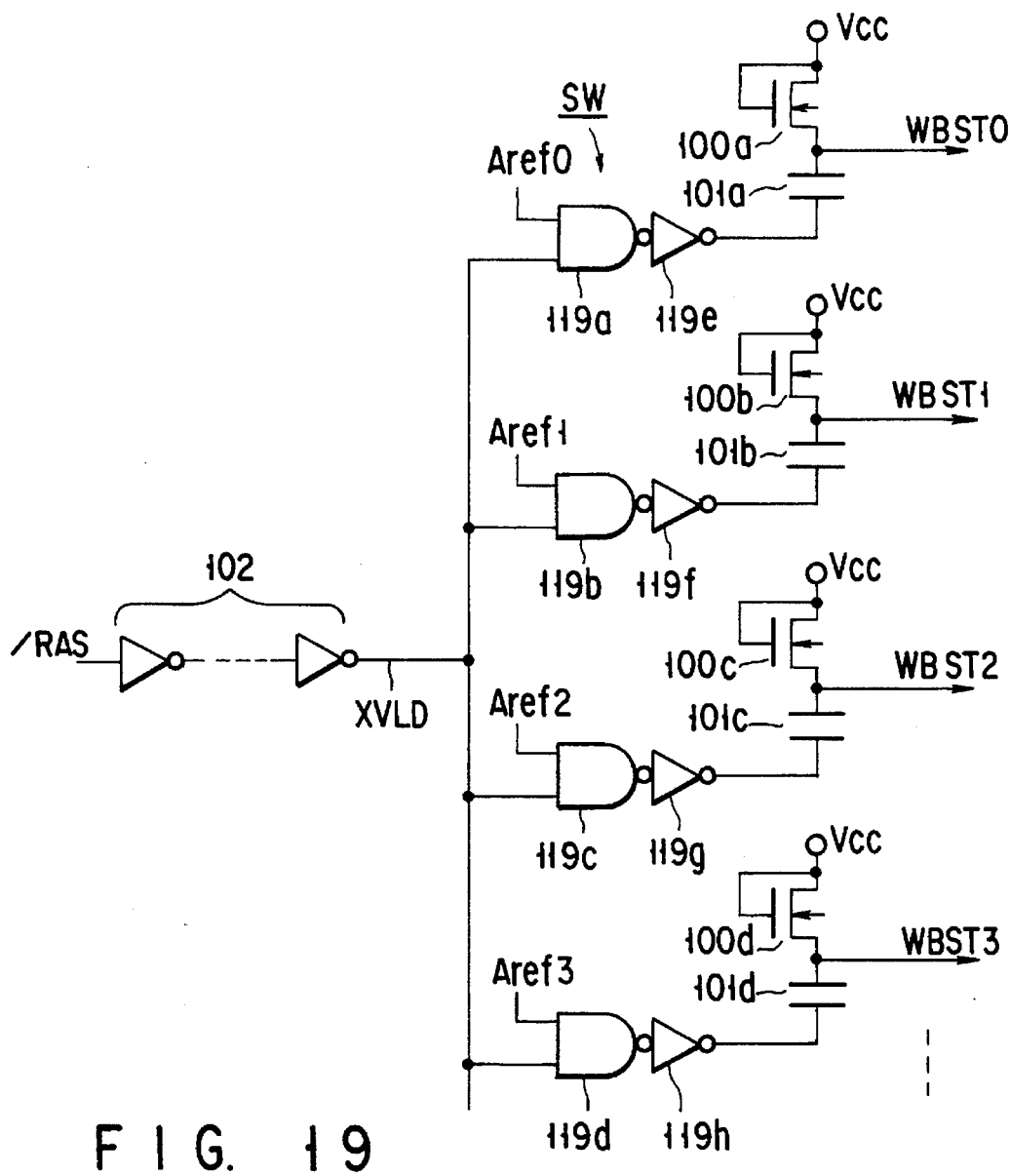
FIG. 19 is a circuit diagram showing a word line drive circuit shown in FIG. 14.

FIG. 19 shows part of the word line drive circuits (WLDC) 146a to 146d including the switch circuits SW. The circuit shown in FIG. 19 is obtained by inserting the switch circuits SW in the boosted potential generating circuit shown in FIG. 11. The same reference numerals as in FIG. 11 denote the same parts in FIG. 19. Note that the number of boosted potentials generated by the word line drive circuit shown in FIG. 19 is larger than the number of boosted potentials generated by the circuit shown in FIG. 11.

Referring to FIG. 19, the output terminal of a delay circuit 102 to which a row address strobe signal RAS is supplied is connected to one input terminal of each of NAND circuits 119a to 119d constituting the switch circuits SW. Switching signals Aref0 to Aref3 are input to the other input terminals of the NAND circuits 119a to 119d. The output terminals of the NAND circuits 119a to 119d are connected to capacitors 101a to 101d through inverter circuits 119e to 119h, respectively.

In the above arrangement, when an XVLD goes to high level in accordance with the row address strobe signal/RAS, input conditions are satisfied in only NAND circuits whose switching signals (Aref0 to Aref3) are set at high level. For example, when the switching signal Aref0 is set at high level, the power supply potential Vcc is applied to the capacitor 101a through the inverter circuit 119e to boost the WBST0 to the power supply potential Vcc or more. The boosted potentials WBST0 to WBST3 are applied to the same circuit as the word line drive voltage generating circuit shown in FIG. 12. This circuit generates the word line drive voltages WDRV0 to WDRV3.

Figure 20:
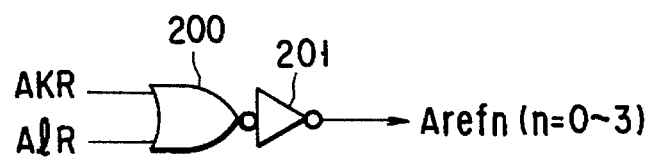
FIG. 20 is a schematic diagram showing a circuit for generating switching signals shown in FIG. 19.

FIG. 20 is a schematic view showing a circuit for generating the switching signals Aref0 to Aref3, and FIG. 21 shows the relationship between input signals and output signals in FIG. 20.

In FIG. 20, the switching signals Aref1 to Aref3 are generated by a NOR circuit 200 and an inverter circuit 201. That is, four circuits, one of which is shown in FIG. 20, are actually arranged. The internal signals AkR and AlR output from the row address buffer circuits 144 are supplied to the input terminals of the NOR circuit 200. The switching signals Aref1 to Aref3 shown in FIG. 21 are output from the inverter circuit 201 in accordance with the combinations of the internal signals AkR and AlR.

Figure 23:
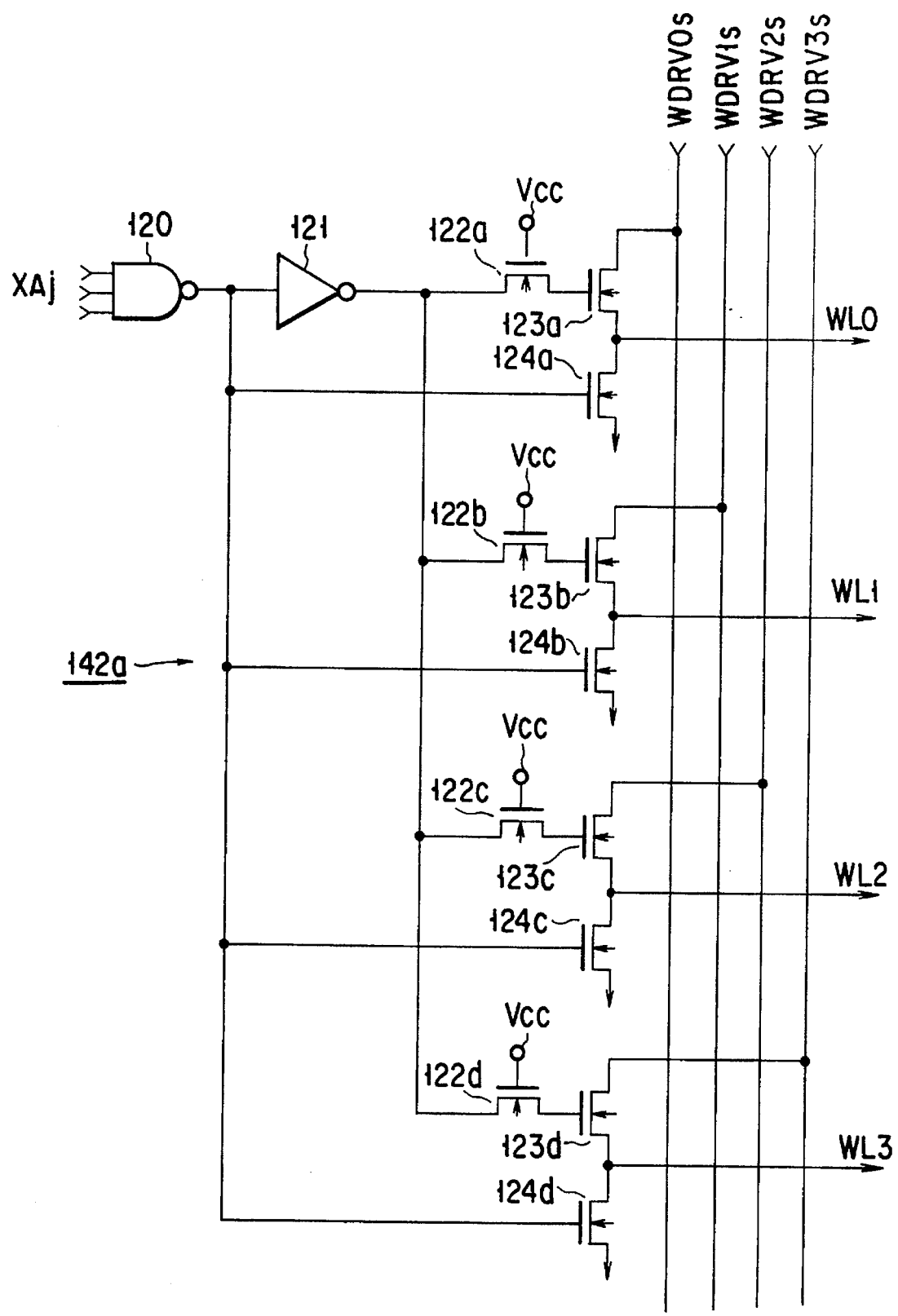
FIG. 23 is a circuit diagram showing the row decoder shown in FIG. 14.

FIGS. 22 and 23 show the row decoders 142a to 142d. The row decoders 142a to 142d have identical arrangements. Each of the row decoders 142a to 142d is constituted by a first decoder for determining a memory cell array block shown in FIG. 22 and a second decoder for determining a word line shown in FIG. 23.

In the first decoder shown in FIG. 22, the memory cell array selection signals RSLn output from the memory cell array selection circuit 145 are supplied to one input terminal of a NAND circuit 220, a selection inhibition signal RSn is supplied to the other input terminal. This selection inhibition signal RSn is supplied from the spare decoder SDC when a failure has occurred in a word line.

The output terminal of the NAND circuit 220 is connected to the drain of each of NMOSs 222a to 222d through an inverter circuit 221. The power supply potential Vcc is supplied to the gate of each of the NMOSs 222a to 222d, and the sources of the NMOSs 222a to 222d are connected to the gates of the NMOSs 223a to 223d, respectively. The word line drive voltages WDRV0 to WDRV3 are applied to the drains of the NMOSs 223a to 223d, respectively, and the sources of the NMOSs 223a to 223d are connected to the drains of NMOSs 224a to 224d, respectively. The source of each of the NMOSs 224a to 224d is connected to the potential Vss, and the gates of the NMOSs 224a to 224d are connected to the output terminal of the NAND circuit 220. The word line drive voltages WDRV0 to WDRV3 are output from the sources of the NMOSs 223a to 223d as voltages WDRV0s to WDRV3s.

In the first decoder, when a refresh operation is performed in 1-k cycle, the memory cell array blocks 141a to 141d shown in FIG. 14 are simultaneously selected; when a refresh operation is performed in 2-k cycle, the memory cell array blocks 141a and 141b shown in FIG. 14 are simultaneously selected, and the memory cell array blocks 141c and 141d are simultaneously selected.

On the other hand, the second decoder shown in FIG. 23 is the same circuit as that shown in FIG. 13 except for voltages applied to the drains of NMOSs 123a to 123d. That is, although the word line drive voltages WDRV0 to WDRV3 are applied to the drains of the NMOSs 123a to 123d in the circuit shown in FIG. 13, respectively, the voltages WDRV0s to WDRV3s output from the first decoder are applied to the drains of the NMOS 123a to 123d in the second decoder shown in FIG. 23.

In the above arrangement, NMOSs 122a to 122d are always set in an ON state. When an output signal from the inverter circuit 121 goes to high level, the NMOSs 123a to 123d are turned on, and a word line drive voltage is output from only an NMOS to which a corresponding one of the voltages WDRVns (n=0 to 3) is applied.

According to the second embodiment of the present invention, the memory cell array blocks 141a to 141d are respectively controlled by the word line drive circuits 146a to 146d in accordance with a refresh cycle. For this reason, when a row failure has occurred in a word line included in a memory cell array of the memory cell array block 141a, the potentials of word lines selected simultaneously with the above word line and included in a memory cell array of another memory cell array block can be prevented from being decreased. Therefore, since a normal word line selected simultaneously with a word line in which a failure has occurred is not regarded as a word line in which a failure has occurred, the yield can be increased without unnecessarily using a redundancy circuit.

Figure 24:
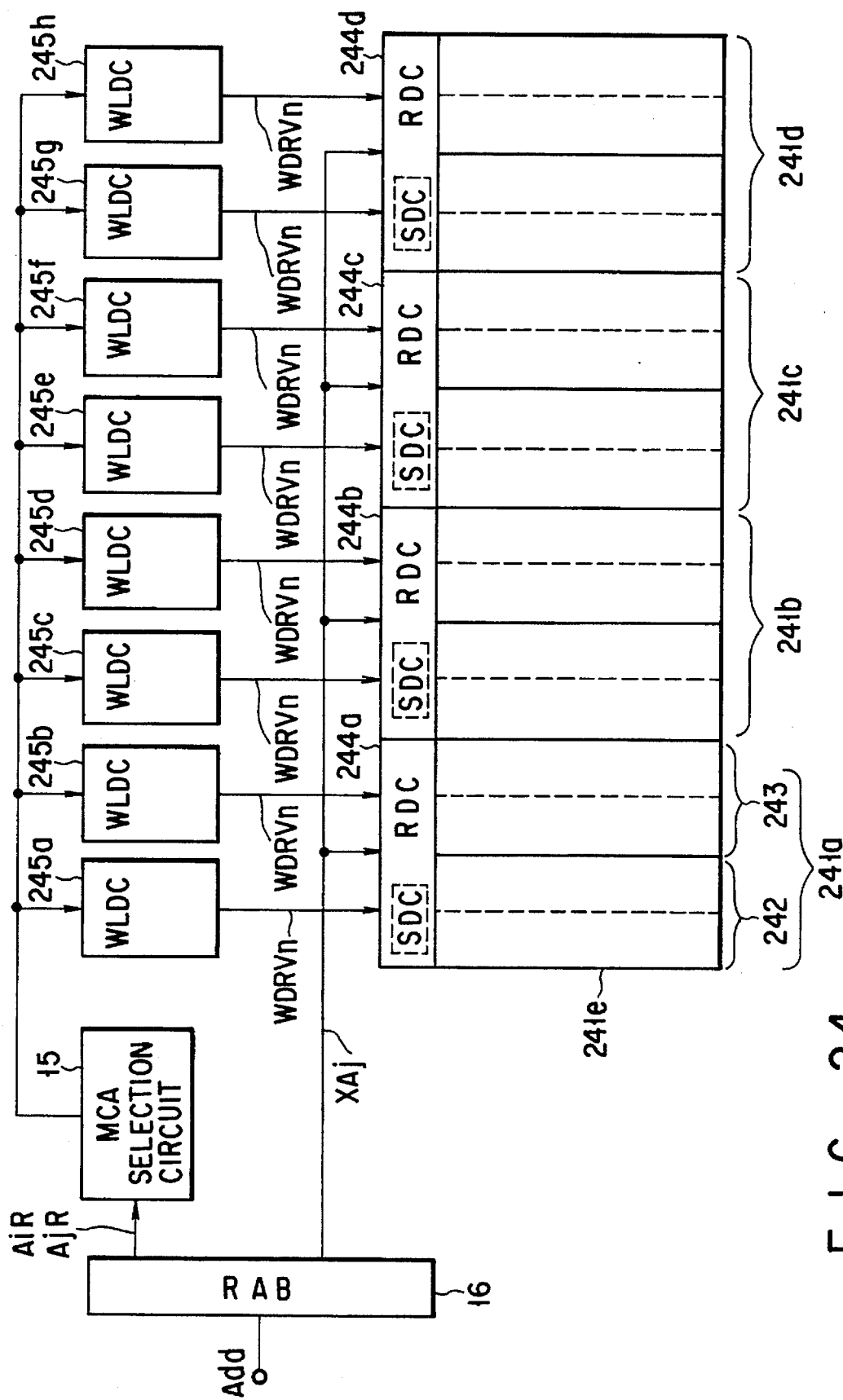
FIG. 24 is a block diagram showing the arrangement of the third embodiment of the present invention.

FIG. 24 shows the third embodiment of the present invention.

The operation unit of a redundancy circuit is generally smaller than the unit of a refresh operation. For this reason, in this embodiment, each redundancy circuit has a word line drive circuit. That is, in each of memory cell array blocks 241a to 241d, reference numeral 241e denotes a minimum memory cell array; 242, a spare memory cell array selected by a spare decoder SDC; and 243, a memory cell array serving as the unit of a refresh operation. Row decoders 244a to 244d are connected to the memory cell array blocks 241a to 241d, respectively. Each of the row decoders 244a to 244d has the same arrangement as the above-described arrangement shown in FIG. 13 and further includes a spare decoder SDC. When a word line in which a failure has occurred is selected, a spare row (not shown) is selected by the spare decoder SDC.

A plurality of word line drive circuits (WLDC) 245a to 245h are connected to a memory cell array selection circuit 15. The memory cell array selection circuit 15 has the same arrangement as shown in FIG. 10, and each of the word line drive circuits 245a to 245h has the same arrangements as shown in FIGS. 11 and 12. Although the potentials WBST0 to WBST2 are output in the arrangement shown in FIG. 11, potentials WBST0 to WBST3 are generated in this embodiment.

The word line drive circuits 245a and 245b are connected to the row decoder 244a, and the word line drive circuits 245c and 245d are connected to the row decoder 244b. In addition, the word linedrive circuits 245e and 245f are connected to the row decoder 244c, and the word line drive circuits 245g and 245h are connected to the row decoder 244d.

In the above arrangement, the word line drive circuits 245a to 245h are simultaneously operated in accordance with the memory array selection signals RSLn output from the memory cell array selection circuit 15, and word line drive voltages WDRVn are simultaneously output from the word line drive circuits 245a to 245h. Therefore, the spare memory cell array 242 selected by a spare decoder and the memory cell array 243 serving as the unit of a refresh operation are respectively driven by the different word line drive voltages WDRVn. For this reason, even when a plurality of word lines are simultaneously selected, a normal word line is not regarded as a word line in which a failure has occurred.

FIG. 25 shows the fourth embodiment of the present invention. This embodiment has a test mode. In this test mode, word lines are selected in units of memory cell arrays. In this case, a plurality of word lines are not simultaneously selected for each refresh cycle.

In this embodiment, memory cell arrays 251 and 252 correspond to the memory cell arrays 22b and 22d shown in FIG. 2. The memory cell array 251 includes memory cell array blocks 251a to 251d, and the memory cell array 252 includes memory cell array blocks 252a to 252d. Row decoders 253a to 253d are provided to the memory cell array blocks 251a to 251d, respectively, and row decoders 254a to 254d are provided to the memory cell array blocks 252a to 252d, respectively. Word line drive circuits (WLDC) 255a to 255d are arranged for the row decoders 253a to 253d, respectively, and word line drive circuits 256a to 256d are arranged for the row decoders 254a to 254d, respectively. These word line drive circuits 255a to 255d and 256a to 256d are operated in accordance with output signals from memory cell array selection circuits 257a and 257b.

Address signals Add are supplied to row address buffer circuits (RAB) 258a and 258b, respectively, and internal signals AkR, AlR, AmR, AnR, and XAj are output from the row address buffer circuits 258a and 258b. Of these internal signals, the internal signals AkR, AlR, AmR, and AnR are supplied to each of the memory cell array selection circuits 257a and 257b, and the internal signal XAj is supplied to each of the row decoders 253a to 253d and 254a to 254d.

A virtual address signal Addv for selecting a memory cell array is supplied to a row address buffer circuit 258c. This virtual address signal Addv is, e.g., a 1-bit signal, and it is supplied to the row address buffer circuit 258c in the test mode. The row address buffer circuit 258c outputs an internal signal AoR or/AoR corresponding to the virtual address signal Addv. The signal AoR or/AoR is supplied to a word line selection control circuit 259 together with a test signal T for setting the test mode. This word line selection control circuit 259 is connected to the memory cell array selection circuits 257a and 257b. When the word line selection control circuit 259 receives the test signal T, the word line selection control circuit 259 outputs signals SL and/SL for selecting one of the memory cell arrays 251 and 252 in accordance with the virtual address signal Addv. The signals SL and/SL are supplied to the memory cell array selection circuits 257a and 257b, respectively.

Figure 26:
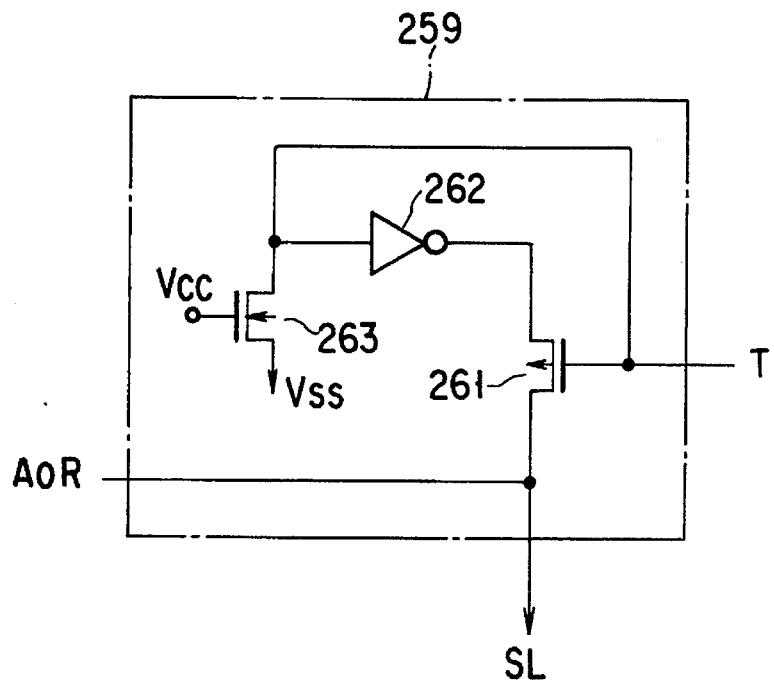
FIG. 26 is a circuit diagram showing a word line selection control circuit shown in FIG. 25.

FIG. 26 shows an example of the word line selection control circuit 259. The test signal T is supplied to the gate of a PMOS 261 and the input terminal of an inverter circuit 262. The drain of an NMOS 263 operating as a resistor is connected to the input terminal of the inverter circuit 262. The output terminal of the inverter circuit 262 is connected to the source of the PMOS 261, and the drain of the PMOS 261 is connected to the row address buffer circuit 258c and, e.g., the memory cell array selection circuit 257a.

In the above arrangement, the test signal T is set at low level in a non-test mode. For this reason, the PMOS 261 is set in an ON state, the input and output terminals of the inverter circuit 262 are set at low and high levels, respectively, and the signal SL output from the gate of the PMOS 261 is set at high level.

On the other hand, the test signal T is set at high level in the test mode, and the PMOS 261 is set in an ON state. In this state, when the virtual address signal Addv is supplied to the row address buffer circuit 258c, the internal signal AoR corresponding to the virtual address signal Addv is output from the row address buffer circuit 258c, and this internal signal AoR is supplied to the memory cell array selection circuit 257a as the signal SL.

Figure 27:
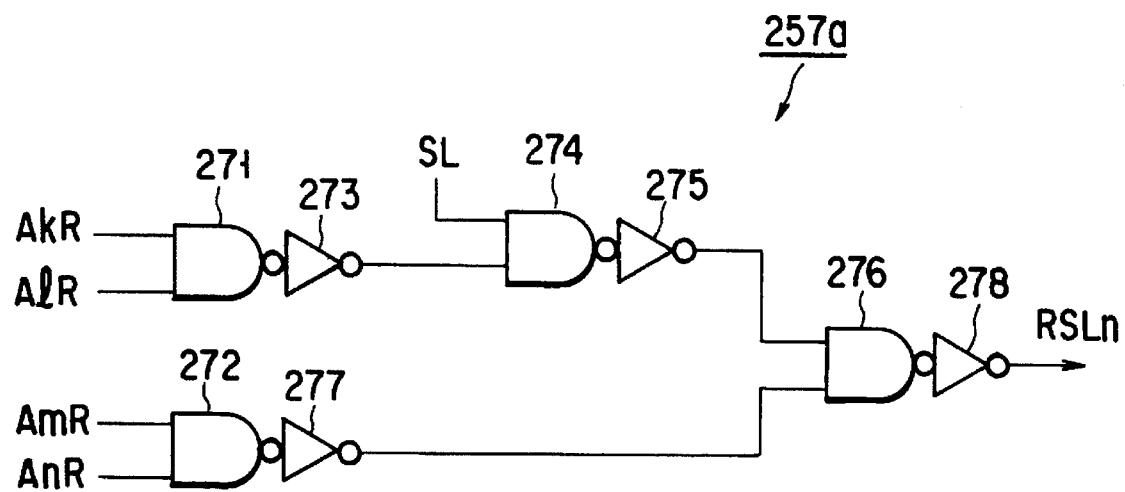
FIG. 27 is a circuit diagram showing a memory cell array selection circuit shown in FIG. 25.

FIG. 27 shows the memory cell array selection circuit 257a or 257b. Since the memory cell array selection circuits 257a and 257b have identical arrangements, only the memory cell array selection circuit 257a will be described below.

The internal signals AkR and AlR output from the row address buffer circuit 258a are supplied to the input terminals of a NAND circuit 271, and the internal signals AmR and AnR are supplied to the input terminals of a NAND circuit 272. The output terminal of the NAND circuit 271 is connected to one input terminal of the NAND circuit 274 through an inverter circuit 273. The signal SL output from the word line selection control circuit 259 is supplied to the other input terminal of the NAND circuit 274. The output terminal of the NAND circuit 274 is connected to one input terminal of a NAND circuit 276 through an inverter circuit 275. The output terminal of the NAND circuit 272 is connected to the other input terminal of the NAND circuit 276 through an inverter circuit 277, and the output terminal of the NAND circuit 276 is connected to the input terminal of an inverter circuit 278. Memory cell array selection signals RSLn are output from the output terminal of the inverter circuit 278.

In the above arrangement, the signal SL output from the word line selection control circuit 259 is normally set at high level as described above. Therefore, the memory cell array selection signals RSLn output from the inverter circuit 278 are changed in accordance with the internal signals AkR, AlR, AmR, and AnR.

On the other hand, in the test mode, when the signal SL goes to low level in accordance with the virtual address signal Addv, all the memory cell array selection signal RSLn go to low level. For this reason, an output signal from the memory cell array selection circuit 257a goes to low level, and no word line drive voltages are output from the word line drive circuits 255a to 255d. At this time, the signal SL of high level is supplied to the memory cell array selection circuits 257a and 257b in accordance with the internal signal AoR, and the memory cell array selection circuit 257b outputs the memory cell array selection signals RSLn in accordance with the internal signals AkR, AZR, AmR, and AnR. Therefore, word line drive voltages are output from the word line drive circuits 256a to 256d, respectively, and the word lines in only the memory cell array 252 can be driven.

According to the embodiment, in the test mode, only the word line in only a memory cell array selected by the virtual address signal, and the memory cell array blocks of the selected memory cell array are respectively driven by different word line drive circuits. Therefore, even in a long-cycle test, a normal word line is not regarded as a word line in which a failure has occurred.

What is claimed is:

1. A semiconductor memory apparatus, comprising:

a plurality of memory cell arrays including a plurality of word lines;

a plurality of selecting circuits, each selecting circuit selecting word lines of a respective corresponding one of said memory cell arrays in accordance with an address signal, said plurality of selecting circuits being operable such that word lines in different memory cell arrays are selected simultaneously; and a plurality of word line driving circuits, each connected to a respective corresponding one of said selecting circuits, for generating word line driving voltages for driving said word lines, whereby selected word lines in each respective memory cell array are driven by word line driving voltages supplied by a different one of said word line driving circuits, each of said word line driving circuits including:

a plurality of transistors each of which has a first terminal of a current path and a gate which are supplied with a power supply voltage; and a plurality of capacitors each of which has a first terminal connected to a second terminal of the current path of a corresponding one of said transistors, and a second terminal supplied with a delayed row address strobe signal for boosting a voltage of the first terminal, the voltages boosted by the capacitors being output from the first terminal of each of the capacitors as the word line driving voltages.

2. A semiconductor memory apparatus comprising:

a plurality of memory cell arrays, each memory cell array including a plurality of word lines;

a plurality of selecting circuits, each selecting circuit selecting word lines of a respective corresponding one of said memory cell arrays in accordance with an address signal, said plurality of selecting circuits being operable such that word lines in different memory cell arrays are selected simultaneously; and a plurality of word line driving circuits, each word line driving circuit generating and supplying word line driving voltages to a respective corresponding one of said selecting circuits, whereby selected word lines in each respective memory cell array are driven by word line driving voltages supplied by a different one of said word line driving circuits, wherein each of said word line driving circuits comprises:

a plurality of transistors each of which has a first terminal of a current path and a gate which are supplied with a power supply voltage;

a plurality of capacitors each of which has a first terminal connected to a second terminal of the current path of a corresponding one of said transistors, and a second terminal supplied with a delayed row address strobe signal for boosting a voltage of said first terminal to a boosted voltage level;

level conversion circuits for converting selection signals for selecting minimum memory cell arrays included in each of said memory cell arrays into boosted voltages at the boosted level, the selection signals having a level of the power supply voltage; and output circuits for outputting the boosted voltages.

3. An apparatus according to claim 2, further comprising:

an address buffer for buffering the address signal; and a selection signal generating circuit for generating the selection signals in accordance with the address signal supplied from said address buffer and for supplying the selection signals to the level conversion circuits of said word line driving circuits.

4. A semiconductor memory apparatus comprising:

a plurality of memory cell arrays, each memory cell array having a plurality of memory cell array blocks and each memory cell array block including a plurality of memory cells connected to word lines;

a refresh cycle setting circuit for setting a refresh cycle for refreshing said memory cells;

first selecting circuits, each provided for a respective corresponding one of said memory cell array blocks, for simultaneously selecting said plurality of memory cell array blocks in accordance with the refresh cycle set by said refresh cycle setting circuit;d a plurality of word line driving circuits, each provided for a respective corresponding one of said first selecting circuits, for generating respective word line driving voltages for driving said word lines; and second selecting circuits for selecting word lines included in each of the memory cell array blocks selected by said first selecting means in accordance with an address signal, said second selecting circuits being operable such that word lines in different memory cell array blocks are selected simultaneously and each of said second selecting circuits supplying word line driving voltages from a different one of said word line driving circuits to the selected word lines, wherein each of said word line driving circuits comprises:

a plurality of transistors each of which has a first terminal of a current path and a gate which are supplied with a power supply voltage;

a plurality of capacitors each having a first terminal connected to a second terminal of the current path of a corresponding one of said transistors;

a plurality of switching circuits each of which has a first input terminal supplied with a delayed row address strobe signal, a second input terminal supplied with a switching signal, and an output terminal connected to a second terminal of one of said capacitors, a voltage of the first terminal of each capacitor being boosted to a voltage having a boosted voltage level in response to the delayed row address strobe signal, and said switching circuits preventing a boosting operation of said capacitors when said switching circuits receive the switching signals;

level conversion circuits for converting selection signals for selecting minimum memory cell arrays of said memory cell array blocks into boosted voltages at the boosted voltage level, the selection signals having a level of the power supply voltage; and an output circuit for outputting the boosted voltages.

5. An apparatus according to claim 4, further comprising:

an address buffer for buffering the address signal; and a selection signal generating circuit for generating the selection signals in accordance with the address signal supplied from said address buffer and for supplying the selection signals to the level conversion circuits of said word line driving circuits.

6. A semiconductor memory apparatus comprising:

a plurality of memory cell array blocks, each memory cell array block having a first memory cell array including a plurality of word lines, and a second memory cell array including word lines for replacing word lines included in said first memory cell array in which a failure has occurred;

first selecting circuits, each provided for a respective corresponding one of said first memory cell arrays, for selecting word lines included in said first memory cell arrays in accordance with an address signal, and second selecting circuits, each provided for a respective corresponding one of said second memory cell arrays, for selecting word lines included in said second memory cell arrays in accordance with the address signal, said first and second selecting circuits being operable such that word lines in different memory cell arrays are selected simultaneously; and word line driving circuits, each provided for a respective corresponding one of said first and second memory cell arrays, for generating word line driving voltages for driving the word lines, wherein said first and second selecting circuits supply driving voltages from a different one of said word line driving circuits to the selected word lines, wherein each of said word line driving circuits comprises:

a plurality of transistors each of which has a first terminal of a current path and a gate which are supplied with a power supply voltage;

a plurality of capacitors each of which has a first terminal connected to a second terminal of the current path of a corresponding one of said transistors, and a second terminal supplied with a delayed row address strobe signal for boosting a voltage of said first terminal to a boosted voltage level;

level conversion circuits for converting selection signals for selecting minimum memory cell arrays of said memory cell arrays into boosted voltages at the boosted voltage level, the selection signals having a level of the power supply voltage; and an output circuit for outputting the boosted voltages.

7. An apparatus according to claim 6, further comprising:

an address buffer for buffering the address signal; and a selection signal generating circuit for generating the selection signals in accordance with the address signals supplied from said address buffer and for supplying the selection signal to the level conversion circuits of said work line driving circuits.

8. A semiconduction memory apparatus, comprising:

a plurality of memory cell arrays, each memory cell array including a plurality of word lines;

a plurality of selecting circuits, each selecting circuit selecting word lines of a respective corresponding one of said memory cell arrays in accordance with an address signal, said plurality of selecting circuits being operable such that word lines in different memory cell arrays are selected simultaneously; and a plurality of word line driving circuits, each word line driving circuit generating and supplying word line driving voltages to a respective corresponding one of said selecting circuits, whereby selected word lines in each respective memory cell array are driven by word line driving voltages supplied by a different one of said word line driving circuits.

9. An apparatus according to claim 8, wherein each of said selecting circuits includes at least one transfer gate, turned on in accordance with the address signal, for applying word line driving voltages to the word lines of the respective corresponding one of said memory cell arrays through said at least one transfer gate.

10. An apparatus according to claim 1, wherein said word line driving circuits boost a power supply voltage to generate the word line driving voltages.

11. A semiconductor memory apparatus, comprising:

a plurality of memory cell arrays, each memory cell array having a plurality of memory cell array blocks and each memory cell array block including a plurality of memory cells connected to word lines;

a refresh cycle setting circuit for setting a refresh cycle for refreshing said memory cells;

first selecting circuits, each provided for a respective corresponding one of said memory cell array blocks, for simultaneously selecting said plurality of memory cell array blocks in accordance with the refresh cycle set by said refresh cycle setting circuit;

a plurality of word line driving circuits, each provided for a respective corresponding one of said first selecting circuits, for generating respective word line driving voltages for driving said word lines; and second selecting circuits for selecting word lines included in each of the memory cell array blocks selected by said first selecting means in accordance with an address signal, said second selecting circuits being operable such that word lines in different memory cell array blocks are selected simultaneously and each of said second selecting circuits supplying word line driving voltages from a different one of said word line driving circuits to the selected word lines.

12. An apparatus according to claim 11, wherein each of said first selecting circuits includes at least one first transfer gate, turned on in accordance with one of the selection signals for selecting said minimum memory cell arrays, for outputting the word line driving voltage, and each of said second selecting circuits includes at least one second transfer gate, turned on in accordance with the address signal, for outputting the word line driving voltage supplied from said first transfer gate to a word line.

13. An apparatus according to claim 11, wherein said word line driving circuits boost a power supply voltage to generate the word line driving voltages.

14. A semiconductor memory apparatus, comprising:

a plurality of memory cell array blocks, each memory cell array block having a first memory cell array including a plurality of word lines, and a second memory cell array including word lines for replacing word lines included in said first memory cell array in which a failure has occurred;

first selecting circuits, each provided for a respective corresponding one of said first memory cell arrays, for selecting word lines included in said first memory cell arrays in accordance with an address signal, and second selecting circuits, each provide for a respective corresponding one of said second memory cell arrays, for selecting word lines included in said second memory cell arrays in accordance with the address signal, said first and second selecting circuits being operable such that word lines in different memory cell arrays are selected simultaneously; and word line driving circuits, each provided for a respective corresponding one of said first and second memory cell arrays, for generating word line driving voltages for driving the word lines, wherein said first and second selecting circuits supply driving voltages from a different one of said word line driving circuits to the selected word lines.

15. An apparatus according to claim 14, wherein each of said first and second selecting circuits includes at least one transfer gate, turned on in accordance with the address signal, for applying word line driving voltages to the word lines of the respective corresponding memory cell array through said at least one transfer gate.

16. An apparatus according to claim 14, wherein said word line driving circuits boost a power supply voltage to generate the word line driving voltages.

17. A semiconductor memory apparatus, comprising:

a plurality of memory cell array blocks, each memory cell array block having a first memory cell array including a plurality of word lines and a second memory cell array including word lines for replacing word lines included in said first memory cell array in which a failure has occurred;

first selecting circuits, each connected to a respective corresponding one of said first memory cell arrays, for selecting word lines included in said first memory cell arrays in accordance with an address signal, and second selecting circuits, each connected to a respective corresponding one of said second memory cell arrays, for selecting word lines included in said second memory cell arrays in accordance with the address signal, said first and second selecting circuits being operable such that word lines in different memory cell arrays are selected simultaneously; and first word line driving circuits, each connected to a respective corresponding one of said first memory cell arrays, and having a generating circuit for generating word line driving voltages for driving said word lines, wherein said first selecting circuits supply word line driving voltages from said first word line driving circuits to the selected word lines; and second word line driving voltage generating circuits, each connected to a respective corresponding one of said second memory cell arrays, and having a generating circuit for generating word line driving voltages for driving said word lines, wherein said second selecting circuits supply word line driving voltages from said second word line driving circuits to the selected word lines.

18. An apparatus according to claim 17, wherein each of said word line driving circuits comprises:

a plurality of transistors each of which has a first terminal of a current path and a gate which are supplied with a power supply voltage:

a plurality of capacitors each of which has a first terminal connected to a second terminal of the current path of a corresponding one of said transistors, and a second terminal supplied with a delayed row address strobe signal for boosting a voltage of said first terminal to a boosted voltage level;

level conversion circuits for converting selection signals for selecting minimum memory cell arrays included in each of said memory cell arrays to boosted voltages at the boosted voltage level, the selection signals having a level of the power supply voltage; and output circuits for outputting the boosted voltages.

19. An apparatus according to claim 17, wherein each of said selecting circuits includes at least one transfer gate, turned on in accordance with the address signal, for applying word line driving voltages to the word lines of the respective corresponding one of said memory cell arrays through said at least one transfer gate.

20. An apparatus according to claim 17, further comprising:

an address buffer for buffering the address signal; and a selection signal generating circuit for generating the selection signals in accordance with the address signal supplied from said address buffer and for supplying the selection signals to the level conversion circuits of said word line driving voltage generating circuits.

21. An apparatus according to claim 17, wherein said first selecting circuit selects the memory cell arrays in accordance with a part of the address signal.

22. An apparatus according to claim 17, wherein each of said second selecting circuit selects the memory cell arrays in accordance with a part of the address signal.

23. A semiconductor memory apparatus comprising:

first and second memory cell arrays, each memory cell array having a plurality of memory cell array blocks including a plurality of word lines;

selecting circuits, each provided for a respective corresponding one of said memory cell array blocks included in said first and second memory cell arrays, for selecting word lines of each of said memory cell array blocks in accordance with an address signal;

first word line driving circuits, each provided for a respective corresponding one of said selecting circuits for selecting word lines of the memory cell array blocks in said first memory cell array, for generating word line driving voltages for driving word lines, wherein first ones of said selecting circuits supply driving voltages from a different one of said first word line driving circuits to the selected word lines of the memory cell array blocks in said first memory cell array;

second word line driving circuits, each provided for a respective corresponding one of said selecting circuits for selecting word lines of the memory cell array blocks in said second memory cell array, for generating word line driving voltages for driving word lines, wherein second ones of said selecting circuits supply driving voltages from a different one of said second word line driving circuits to the selected word lines of the memory cell array blocks in the second memory cell array; and a selection control circuit, connected to said first and second word line driving circuits, for selecting and activating either said first word line driving circuits or said second word line driving circuits in accordance with a word line driving circuit selecting signal when a memory cell array selecting signal for selecting said first and second memory cell arrays and a test signal for setting a test mode are supplied to said selection control circuit.

24. An apparatus according to claim 23, wherein each of said selecting circuits includes at least one transfer gate, turned on in accordance with the address signal, for applying a word line driving voltages to the word lines of the respective corresponding memory cell array block through said at least one transfer gate.

25. An apparatus according to claim 24, wherein said selection control circuit comprises:

an inverter circuit having an input terminal supplied with the test signal; and a transistor having a first terminal of a current path connected to an output terminal of said inverter circuit, a gate supplied with the test signal, and a second terminal of the current path supplied with the memory cell array selecting signal.

26. An apparatus according to claim 23, wherein the memory cell array selecting signal is a virtual address signal.

27. An apparatus according to claim 23, wherein said word line driving circuits boost a power supply voltage to generate the word line driving voltages.

28. An apparatus according to claim 23, wherein each of said word line driving circuits comprises:

a plurality of transistors each of which has a first terminal of a current path and a gate which are supplied with a power supply voltage;

a plurality of capacitors each of which has a first terminal connected to a second terminal of the current path of a corresponding one of said transistors, and a second terminal supplied with a delayed row address strobe signal for boosting a voltage of said first terminal into a voltage having a boosted voltage level;

level conversion circuits for converting selection signals for selecting minimum memory cell arrays of said memory cell array blocks into boosted voltages at the boosted voltage level, the selection signals having a level of the power supply voltage; and an output circuit for outputting the boosted voltages.

29. An apparatus according to claim 28, further comprising:

an address buffer for buffering an address signal; and a selection signal generating circuit for generating the selection signals for selecting minimum memory cell arrays in accordance with the address signal supplied from said address buffer and for supplying the selection signals for selecting minimum memory cell arrays to the level conversion circuits of said word line driving circuits.

30. A semiconductor memory apparatus, comprising:

a plurality of memory cell arrays, each memory cell array having a plurality of minimum memory cell arrays including a plurality of word lines;

a first selecting circuit for selecting one of said minimum memory cell arrays of said each memory cell array in accordance with an address signal;

a plurality of second selecting circuits, each second selecting circuit selecting word lines of each minimum memory cell array selected by said first selecting circuit in accordance with the address signal, said plurality of second selecting circuits being operable such that word lines in different memory cell arrays are selected simultaneously; and a plurality of word line driving circuits, each word line driving circuit being connected to one of said second selecting circuits, respectively, said each word line driving circuit generating word line driving voltages and supplying the word line driving voltages to a corresponding one of said second selecting circuits, wherein each of the word line driving voltages is supplied to select one of said word lines in said each minimum memory cell array.

31. An apparatus according to claim 30, wherein each of said word line driving circuits comprises:

a plurality of transistors each of which has a first terminal of a current path and a gate which are supplied with a power supply voltage;

a plurality of capacitors each of which has a first terminal connected to a second terminal of the current path of a corresponding one of said transistors, and a second terminal supplied with a delayed row address strobe signal for boosting a voltage of said first terminal to a boosted voltage level;

level conversion circuits for converting selection signals for selecting said minimum memory cell arrays included in each of said memory cell arrays into boosted voltages at the boosted voltage level, the selection signals having a level of the power supply voltage; and output circuits for outputting the boosted voltages.

32. An apparatus according to claim 30, wherein each of said second selecting circuits includes at least one transfer gate, turned on in accordance with the address signal, for applying word line driving voltages to the word lines of the respective corresponding one of said memory cell arrays through said at least one transfer gate.

33. An apparatus according to claim 30, further comprising:

an address buffer for buffering the address, and supplying a first part of the address signal to said first selecting circuit and a second part of the address signal to said second selecting circuit.

34. An apparatus according to claim 30, wherein said each second selecting circuit selects said word lines such that the number of selected word lines is twice as many as the number of said word line driving voltage generating circuits.

35. An apparatus according to claim 30, wherein said each second selecting circuit selects said word lines such that the number of selected word lines is four times as many as the number of said word line driving voltage generating circuits.

36. An apparatus according to claim 30, wherein said each second selecting circuit selects said word lines such that selected word lines are larger in number than said word line driving voltage generating circuits.

37. A semiconductor memory apparatus, comprising:

a plurality of memory cell arrays, each memory cell array including a plurality of word lines;

a plurality of selecting circuits, each selecting circuit selecting word lines of a respective corresponding one of said memory cell arrays in accordance with an address signal, said plurality of selecting circuits being operable such that word lines in different memory cell arrays are selected simultaneously; and a plurality of word line driving circuits, each word line driving circuit being connected to said each selecting circuit and having a generating circuit for generating word line driving voltages which are supplied to a respective corresponding one of said selecting circuits, whereby selected word lines in each respective memory cell array are driven by word line driving voltages supplied by a different one of said word line driving circuits.

38. An apparatus according to claim 37, wherein each of said word line driving circuits comprises:

a plurality of transistors each of which has a first terminal of a current path and a gate which are supplied with a power supply voltage;

a plurality of capacitors each of which has a first terminal connected to a second terminal of the current path of a corresponding one of said transistors, and a second terminal supplied with a delayed row address strobe signal for boosting a voltage of said first terminal to a boosted voltage level;

level conversion circuits for converting selection signals for selecting minimum memory cell arrays included in each of said memory cell arrays into boosted voltages at the boosted voltage level, the selection signals having a level of the power supply voltage; and output circuits for outputting the boosted voltages.

39. An apparatus according to claim 37, wherein each of said selecting circuits includes at least one transfer gate, turned on in accordance with the address signal, for applying word line driving voltages to the word lines of the respective corresponding one of said memory cell arrays through said at least one transfer gate.

40. An apparatus according to claim 37, further comprising:

an address buffer for buffering the address signal; and a selection signal generating circuit for generating the selection signals in accordance with the address signal supplied from said address buffer and for supplying the selection signals to the level conversion circuits of said word line driving circuits.

41. An apparatus according to claim 37, wherein said each selecting circuit selects said word lines such that the number of selected word lines is twice as many as the number of said word line driving voltage generating circuits.

42. An apparatus according to claim 37, wherein said each selecting circuit selects said word lines such that the number of selected word lines is four times as many as the number of said word line driving voltage generating circuits.

43. An apparatus according to claim 37, wherein said each selecting circuit selects said word lines such that selected word lines are larger in number than said word line driving voltage generating circuits.

* * * * *